(12) United States Patent
Yamada et al.

(10) Patent No.: US 6,518,196 B2
(45) Date of Patent: Feb. 11, 2003

(54) METHOD OF MANUFACTURING SEMICONDUCTOR DEVICE

(75) Inventors: Tetsuya Yamada, Tokyo (JP);
Kouichirou Tsujita, Tokyo (JP);
Atsumi Yamaguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/960,924

(22) Filed: Sep. 25, 2001

(65) Prior Publication Data

US 2002/0160619 A1 Oct. 31, 2002

(30) Foreign Application Priority Data

Apr. 27, 2001 (JP) ........................................ 2001-131373

(51) Int. Cl.[7] .............................................. H01L 21/461
(52) U.S. Cl. ........................ 438/725; 438/780; 438/783; 438/949; 148/DIG. 137
(58) Field of Search ................................. 438/780, 783, 438/723, 725, 949; 148/DIG. 137

(56) References Cited

U.S. PATENT DOCUMENTS 4,321,317 A * 3/1982 MacIver ...................... 427/526
4,410,611 A * 10/1983 MacIver ...................... 427/525
6,306,780 B1 * 10/2001 Bourdelle et al. ............. 438/798

FOREIGN PATENT DOCUMENTS

| EP | 338110 A1 | * 10/1989 |
| EP | 908786 A2 | * 4/1999 |
| JP | 4-127518 | 4/1992 |
| JP | 8-153714 | 6/1996 |
| JP | 10-41309 | 2/1998 |

* cited by examiner

*Primary Examiner*—Trung Dang
(74) *Attorney, Agent, or Firm*—Oblon, Spivak, McClelland, Maier & Neustadt, P.C.

(57) ABSTRACT

The present invention provides a method of manufacturing a semiconductor device that reduces pitch dependence which represents a characteristic that the hole diameter decreases with increasing hole pitch. In the surface of a resist (1) where holes (5a–5e) having pitch dependence are formed, Ar⁺ ions of an inert gas are vertically implanted, for example, at an energy of 50 keV at a dose of $5.0 \times 10^{15}$ cm$^{-2}$. The ion implantation in the resist (1) shrinks the resist (1) and increases the hole diameters of the holes (5a–5e). At this time, since the hole diameters of the holes (5a–5d) of small hole pitches increase by a smaller amount than the hole diameter of the hole (5e) of a great hole pitch, the pitch dependence of the holes (5a–5e) can be reduced.

12 Claims, 29 Drawing Sheets

F I G . 2 8
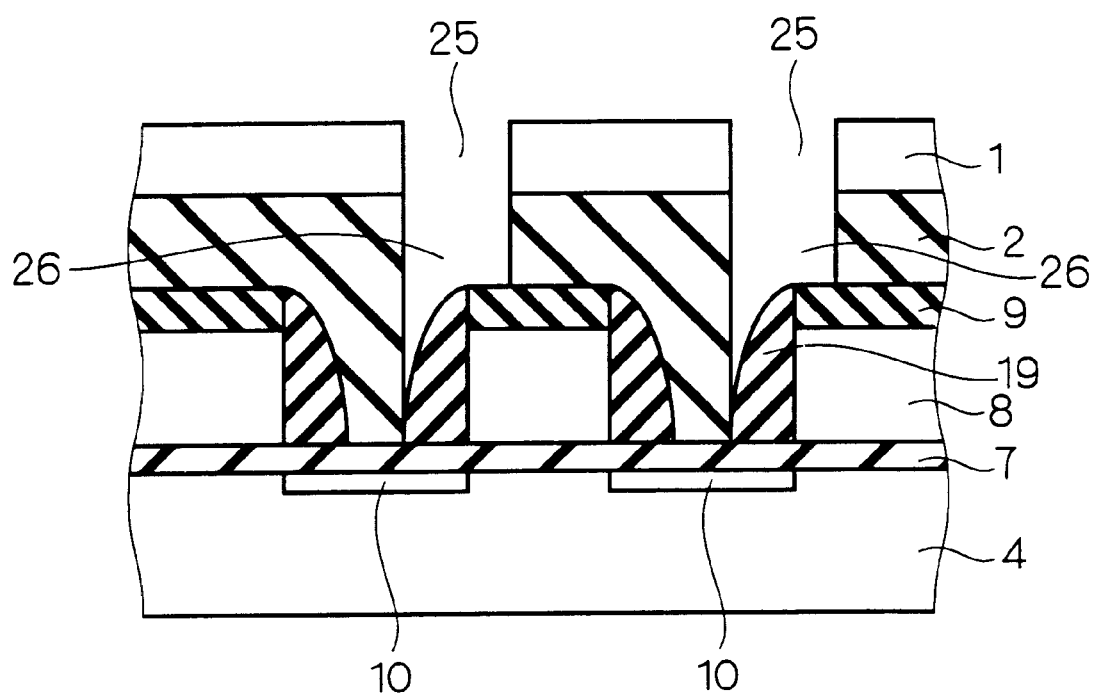

F I G. 3 4
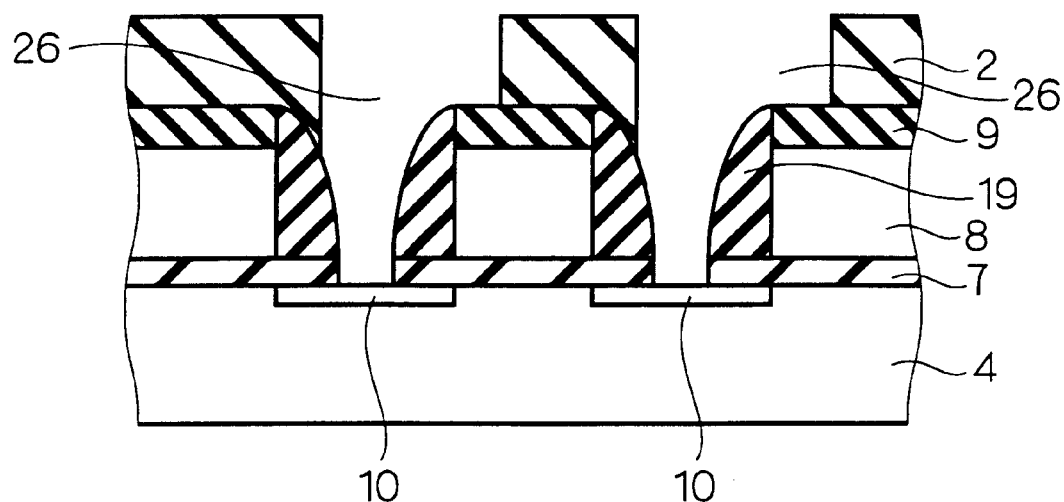
F I G. 3 5
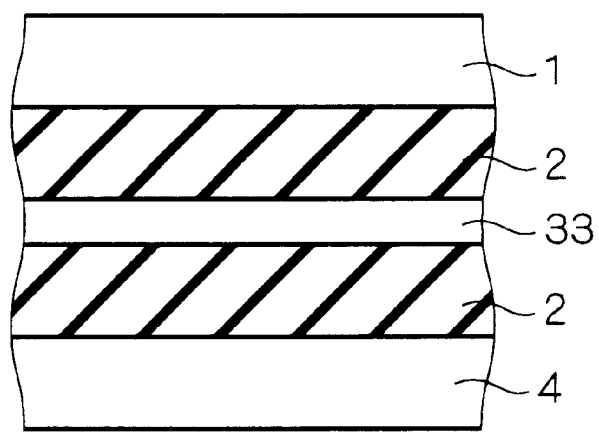

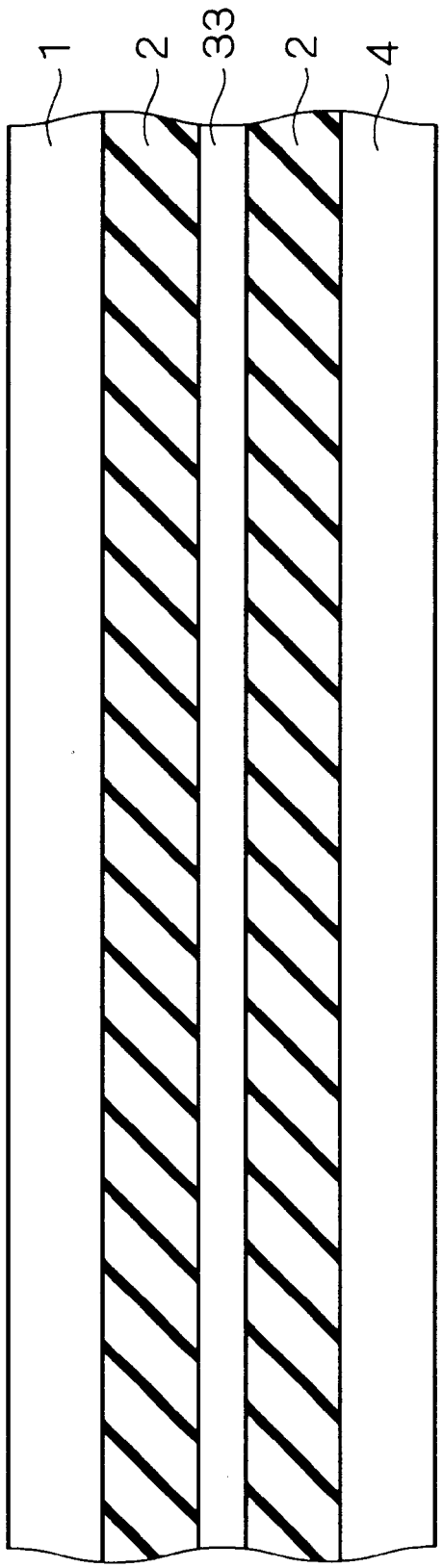
F I G . 4 2

METHOD OF MANUFACTURING SEMICONDUCTOR DEVICE

BACKGROUND OF THE INVENTION

1. Field of the Invention

The present invention relates to a method of manufacturing a semiconductor device, and especially to a method of forming resist holes using lithography techniques.

2. Description of the Background Art

As semiconductor device dimensions have been more and more decreasing in recent years, in terms of control of resist hole dimensions by lithography techniques, it is getting increasingly difficult to form resist holes of the same diameter (the resist hole diameter is hereinafter referred to as a "hole diameter"). The resist hole is a hole formed in a resist, the resist being a masking material in formation of a contact hole in an interlayer film on a semiconductor substrate, for example. It is hereinafter simply referred to as a "hole".

In formation of holes in a resist by a projection aligner, the hole diameter may have pitch dependence depending on lighting conditions of the projection aligner. The pitch dependence represents a characteristic that when a resist has a plurality of holes, the hole diameter varies depending on the center-to-center distance of adjacent holes (hereinafter referred to as a "hole pitch").

Now, the pitch dependence will be set forth in more detail. FIGS. 49 and 50 are graphs of the relationship between the hole pitch and the hole diameter in conventional techniques, the graphs illustrating simulation results in consideration of only an optical system in a projection aligner. A laser used in the simulations is a KrF excimer laser operating at wavelengths of 248 nm, and the dimensions of holes in a masking material for use in formation of holes in a resist are 0.22 μm. A desired design value for the hole diameter is 0.16 μm.

FIG. 49 is a graph for a constant NA (NA=0.6) and σ=0.6, 0.7, and 0.8; and FIG. 50 is a graph for a constant σ (σ=0.6) and NA=0.6, 0.65, and 0.7. NA is the numerical aperture of a lens between a resist formed on the semiconductor substrate, and a masking material for use in formation of holes in a resist. NA represents the resolution of the lens. σ is a constant given by $$\sigma = iNA/NA \quad (1)$$

where iNA is the numerical aperture for light incident on the masking material.

As shown in FIG. 49, under the lighting conditions of NA=0.6 and σ=0.6, the hole diameter, when the hole pitch is between 0.4 and 0.5 μm, is mostly smaller than the desired design value of 0.16 μm, and as the hole pitch increases, the hole diameter mostly increases. For the hole pitch between 0.5 and 1.0 μm, the hole diameter is nearly equal to the desired design value of 0.16 μm. Under the lighting conditions of NA=0.6 and σ=0.7, the hole diameter, when the hole pitch is between 0.4 and 0.5 μm, is slightly larger than the desired design value of 0.16 μm, but as a whole, it is nearly equal to the desired design value of 0.16 μm. Under the lighting conditions of NA=0.6 and σ=0.8, the hole diameter, when the hole pitch is between 0.4 and 0.6 μm, is larger than the desired design value of 0.16 μm, and as the hole pitch increases, the hole diameter mostly decreases. For the hole pitch between 0.6 and 1.0 μm, the hole diameter is nearly equal to the desired design value of 0.16 μm.

On the other hand, as shown in FIG. 50, under the lighting conditions of NA=0.6 and σ=0.6, the hole diameter, when the hole pitch is between 0.4 and 0.5 μm, is mostly smaller than the desired design value of 0.16 μm and as the hole pitch increases, the hole diameter mostly increases. For the hole pitch between 0.5 and 1.0 μm, the hole diameter is nearly equal to the desired design value of 0.16 μm. Under the lighting conditions of NA=0.65 and σ=0.6, the hole diameter, when the hole pitch between 0.4 and 0.5 μm, is slightly smaller than the desired design value of 0.16 μm, but as a whole, it is nearly equal to the desired design value of 0.16 μm. Under the lighting conditions of NA=0.7 and σ=0.6, the hole diameter is nearly equal to the desired design value, 0.16 μm.

As above described, under some lighting conditions (the values NA and σ) of the projection aligner and for the hole pitch between 0.4 and 0.5 μm or between 0.4 and 0.6 μm, the hole diameter has a characteristic of depending on the hole pitch. The aforementioned "pitch dependence" refers to this characteristic.

As shown in FIGS. 49 and 50, the pitch dependence of the hole diameter can be virtually eliminated by the settings of NA=0.6 and σ=0.7 or the settings of NA=0.7 and σ=0.6. The values NA and σ, however, exercise influence on the resolution and focal depth of a lens for focusing light on the resist and therefore, they cannot be determined for only the purpose of eliminating the pitch dependence. Besides, the values NA and σ may sometimes be fixed by the specifications of the projection aligner, in which case they cannot be determined freely on the manufacturing end of the semiconductor device. That is, the hole diameters of holes formed in a resist may have pitch dependence depending on the required resolution and focal depth and depending on the projection aligner to be used.

Let the lighting conditions be NA=0.6 and σ=0.8 based on the required resolution and focal depth and on a projection aligner to be used. At this time, as shown in FIG. 49, the hole diameter, when the hole pitch is between 0.4 and 0.6 μm, mostly decreases with increasing hole pitch. Use of a projection aligner with a small σ for reduction of such pitch dependence creates a problem of reducing the resolution of a lens. Use of a projection aligner with a large NA for reduction of the pitch dependence creates a problem of reducing the focal depth of a lens; in addition, such a projection aligner with a large NA is expensive and therefore, reducing the pitch dependence through the use of such a projection aligner becomes a cause of increasing the semiconductor device manufacturing cost. While in the above description, the lighting conditions of NA=0.6 and σ=0.8 are presented as conditions for developing the pitch dependence which represents the characteristic that the hole diameter decreases with increasing hole pitch, the hole diameter also varies according to the type of a resist to be used and to the diameters of holes in a masking material for use in formation of holes in a resist. Therefore, not only the lighting conditions of NA=0.6 and σ=0.8 but also various other conditions develop the above pitch dependence.

SUMMARY OF THE INVENTION

A first aspect of the present invention is directed to a method of manufacturing a semiconductor device, comprising the steps of: (a) forming a resist on an object to be etched; (b) forming in the resist a plurality of holes a pitch of which includes different pitches; and (c) performing ion implantation on the resist to reduce pitch dependence caused to diameters of the holes.

According to a second aspect of the present invention, the method of manufacturing a semiconductor device of the first aspect further comprises the step of: (d) between the steps (b) and (c), performing processing for reduction of the diameters of the holes.

A third aspect of the present invention is directed to a method of manufacturing a semiconductor device, comprising the steps of: (a) forming a resist on an object to be etched; and (b) forming a plurality of holes in the resist, wherein the holes include a first hole of a first pitch and a second hole of a second pitch larger than the first pitch. The method further comprises the step of: (c) performing ion implantation on the resist to make the amount of increase in the diameter of the second hole larger than that in the diameter of the first hole.

A fourth aspect of the present invention is directed to a method of manufacturing a semiconductor device, comprising the steps of: (a) forming a resist on an object to be etched; (b) forming in the resist a plurality of holes having center-to-center distance of not more than 0.5 µm between holes and having diameters smaller than a desired diameter, and (c) performing ion implantation on the resist to increase the diameters of the holes to the desired diameter.

According to a fifth aspect of the present invention, in the method of manufacturing a semiconductor device of the first through fourth aspects, an ion used for the ion implantation is an ion of an inert gas.

In the fifth aspect of the present invention, the ion is preferably an Ar ion.

In the method of manufacturing a semiconductor device according to the first aspect of the present invention, the diameters of holes of great pitches increase by a larger amount than the diameters of holes of small pitches. This allows a reduction in pitch dependence caused to the hole diameters.

In the method of manufacturing a semiconductor device according to the second aspect of the present invention, the reduction processing in the step (d) and the ion implantation in the step (c) can improve resistance of the resist to etching and can reduce a difference between the hole diameter in the step (b) and the hole diameter after the ion implantation in the step (c).

In the method of manufacturing a semiconductor device according to the third aspect of the present invention, ion implantation in the resist having holes increases the hole diameter according to the pitch. Consequently, it is possible to increase the hole diameter while maintaining insulation between holes of small pitches.

In formation of holes having center-to-center distances of 0.5 µm or less in the resist, various optical problems arise if the hole diameters are increased to a desired value by varying lighting conditions of a projection aligner. In the method of manufacturing a semiconductor device according to the fourth aspect of the present invention, however, the hole diameters are increased to a desired value by ion implantation in the resist. This minimizes the occurrence of such optical problems.

In the method of manufacturing a semiconductor device according to the fifth aspect of the present invention, use of ions other than an inert gas for ion implantation degrades semiconductor device characteristics because of ion penetration in the resist or ion diffusion in the object to be etched. In the present invention, however, since an ion of an inert gas is used for ion implantation, there occur less ion penetration in the resist and less ion diffusion in the object to be etched. Accordingly, there is less degradation in semiconductor device characteristics than when using an ion of a gas other than inert gases.

An object of the present invention is to provide a method of manufacturing a semiconductor device that reduces pitch dependence which represents a characteristic that the hole diameter decreases with increasing hole pitch.

These and other objects, features, aspects and advantages of the present invention will become more apparent from the following detailed description of the present invention when taken in conjunction with the accompanying drawings.

BRIEF DESCRIPTION OF THE DRAWINGS

FIG. 28 is a cross-sectional view for explaining problems in the SAC process;

FIGS. 30 to 34 are cross-sectional views illustrating a method of manufacturing a semiconductor device according to a third preferred embodiment of the present invention;

FIGS. 35 to 37 are cross-sectional views for explaining a thermal flow process;

FIGS. 42 to 46 are cross-sectional views illustrating a method of manufacturing a semiconductor device according to a fourth preferred embodiment of the present invention;

DESCRIPTION OF THE PREFERRED EMBODIMENTS

In the specification, "pitch dependence" refers to a characteristic that the hole diameter decreases with increasing hole pitch.

Figure 1:
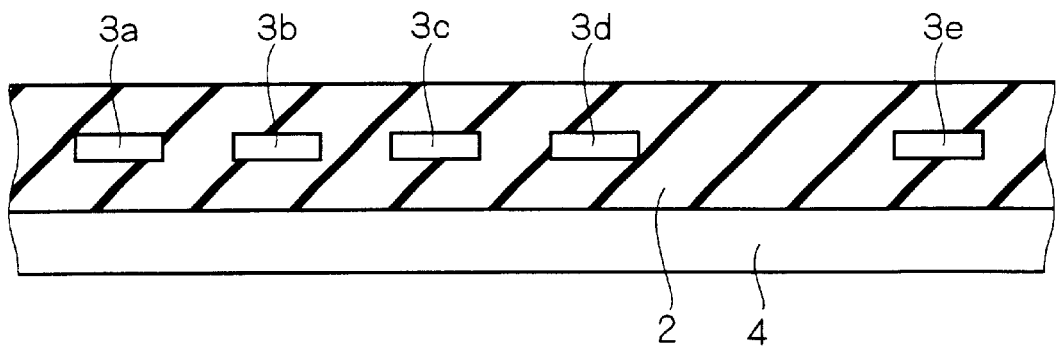
FIGS. 1 to 7 are cross-sectional views illustrating a method of manufacturing a semiconductor device according to a first preferred embodiment of the present invention.

FIGS. 1 to 7 are cross-sectional views illustrating a method of manufacturing a semiconductor device according to a first preferred embodiment. As shown in FIG. 1, wires 3a to 3e of polysilicon, for example, are formed on a silicon substrate 4 and an interlayer film 2 is formed to cover the wires 3a to 3e. The interlayer film 2 is formed of an oxide film such as $SiO_2$ or of a low-permittivity film such as SiOC or SiC, for example.

Figure 2:
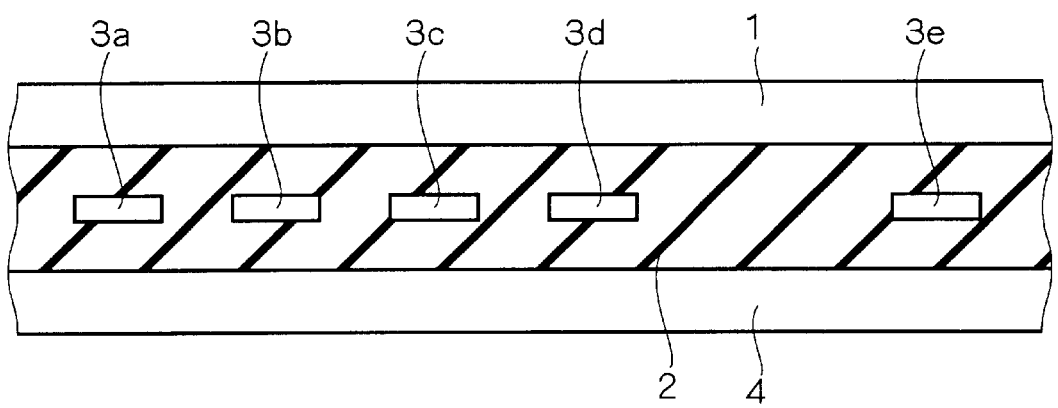
Figure 3:
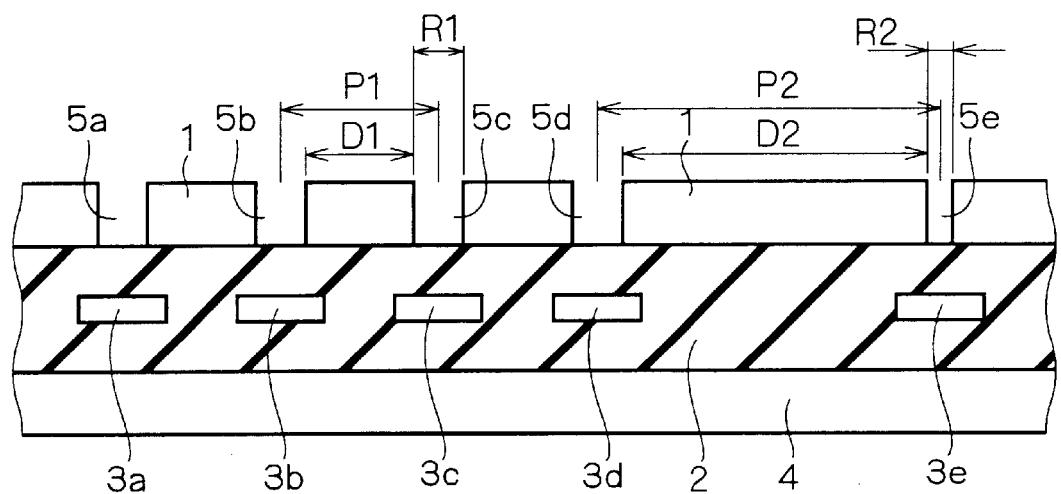

As shown in FIG. 2, a resist 1 of 585 nm thickness, for example, is formed on the interlayer film 2. The resist 1 is, as shown in FIG. 3, exposed and developed to form holes 5a to 5d of hole pitches P1 and a hole 5e of a hole pitch P2 greater than the hole pitches P1. Depending on the required resolution and focal depth and on a projection aligner to be used, the holes 5a to 5e have the aforementioned pitch dependence. That is, the hole diameters R1 of the holes 5a to 5d of small hole pitches are larger than the hole diameter R2 of the hole 5e of a great hole pitch. The holes 5a to 5e are formed in a one-to-one correspondence with the wires 3a to 3e. A hole interval D1 or D2 is the distance between the outlines of one hole and its adjacent hole, and the hole interval D1 for the holes 5a to 5d is smaller than the hole interval D2 for the hole 5e. Hereinafter, both the "hole pitch" and the "hole interval" may simply be referred to as a "pitch".

Figure 4:
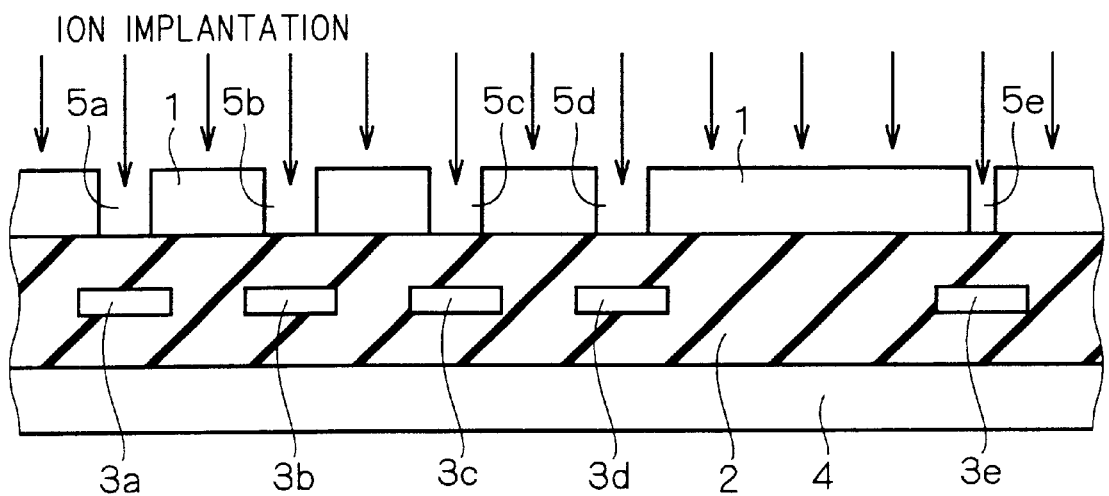
Figure 5:
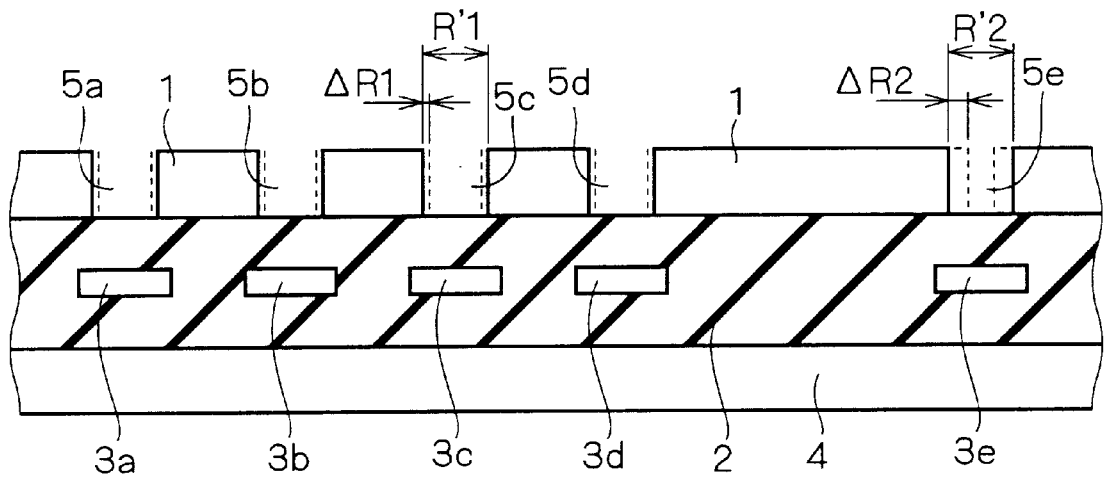

Next, as shown in FIG. 4, $Ar^+$ ions of an inert gas are implanted vertically into the surface of the resist 1, for example, at an energy of 50 keV at a dose of $5.0 \times 10^{15}$ $cm^{-2}$. At this time, $Ar^+$ is also implanted in the interlayer film 2 since the resist 1 has the holes 5a to 5e. The ion implantation in the resist 1, as shown in FIG. 5, shrinks the resist 1 and increases the hole diameters R1 of the holes 5a to 5d to R'1 and the hole diameter R2 of the hole 5e to R'2. The amount of increase in the hole diameters of the holes 5a to 5e by the ion implantation represents a characteristic of reducing the pitch dependence. More specifically, the amount of increase $\Delta R1$ in the hole diameters R1 of the holes 5a to 5d of small pitches is smaller than the amount of increase $\Delta R2$ in the hole diameter R2 of the hole 5e of a great pitch. This is because the amount of shrinkage of the resist 1 depends on the amount of the resist 1. Since there is a smaller amount of the resist 1 around the holes 5a to 5d than around the hole 5e, the resist 1 shrinks by a smaller amount around the holes 5a to 5d than around the hole 5e. Consequently, the pitch dependence developed in the step of FIG. 3 is reduced and the hole diameters R'1 of the holes 5a and 5d after ion implantation become nearly equal to the hole diameter R'2 of the hole 5e after ion implantation. Details of such shrinkage of the resist 1 by ion implantation are disclosed for example in Japanese Patent Laid-Open No. 4-127518 (1992).

Figure 6:
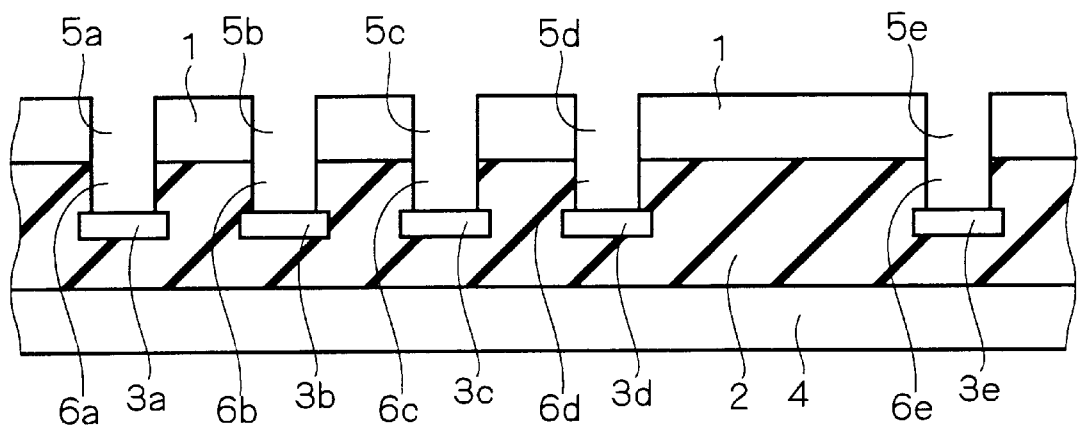
Figure 7:
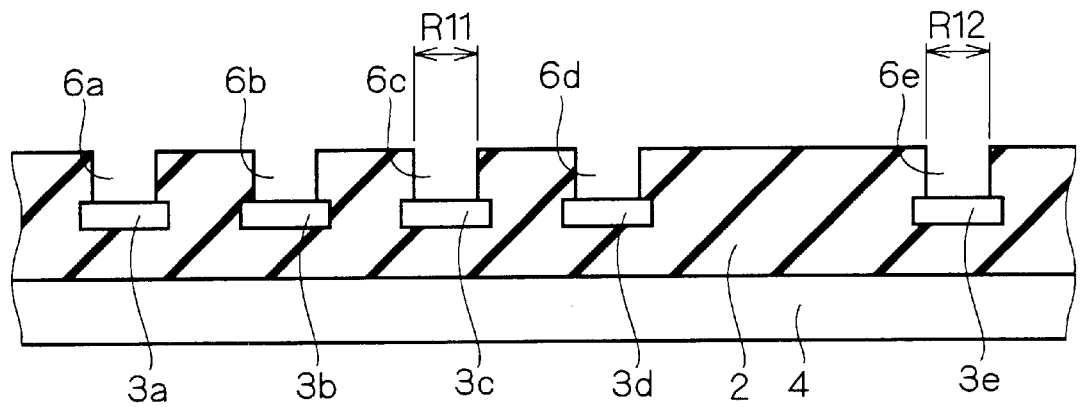

Using the resist 1 as a masking material, as shown in FIG. 6, the interlayer film 2 is etched to form contact holes 6a to 6e. The contact holes 6a to 6e are connected to the wires 3a to 3e, respectively. In the aforementioned ion implantation of FIG. 4, ions are implanted also into the holes 5a to 5e where no resist 1 is present, and accordingly the interlayer film 2 is also ion implanted. In the step of FIG. 6, however, etching is performed on portions of the interlayer film 2 which have no resist 1 on the surface; therefore, the influence of ion implantation on the interlayer film 2 can be reduced. The resist 1 is then removed as shown in FIG. 7, which completes the formation of the contact holes 6a to 6e. At this time, the diameters R11 of the contact holes 6a to 6d are nearly equal to the diameter R12 of the contact hole 6e.

Figure 8:
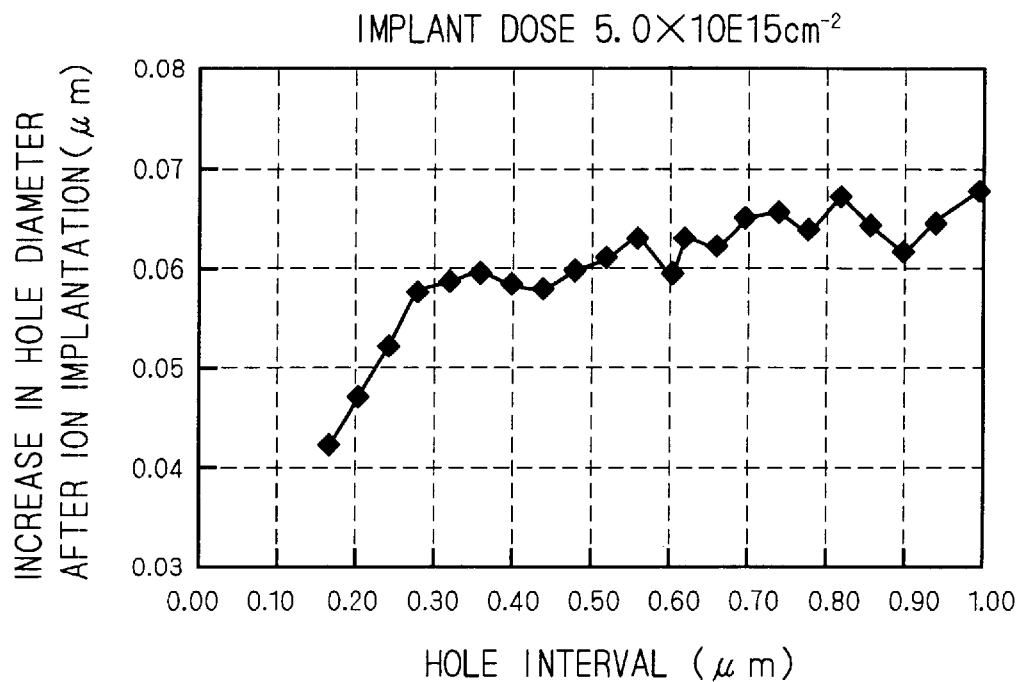
FIG. 8 is a graph showing the characteristics of the amount of increase in the hole diameter after ion implantation according to the first preferred embodiment.

FIG. 8 is a graph showing the characteristics of the amount of increase in the hole diameter after ion implantation according to the first preferred embodiment, the graph illustrating actual experimental results. The horizontal axis of the graph indicates the hole interval before ion implantation. The vertical axis of the graph indicates the amount of increase in the hole diameter of a hole which is formed before ion implantation and which has a diameter of 0.2 $\mu$m. The ionic species to be used is $Ar^+$, the ion implant energy is 50 keV, the ion implant dose is $5.0 \times 1015$ $cm^{-2}$, and a resist to be used has a film thickness of 585 nm. As shown in FIG. 8, the larger the hole interval for the hole, i.e., the greater the hole pitch, the larger the amount of increase in the hole diameter after ion implantation.

Figure 9:
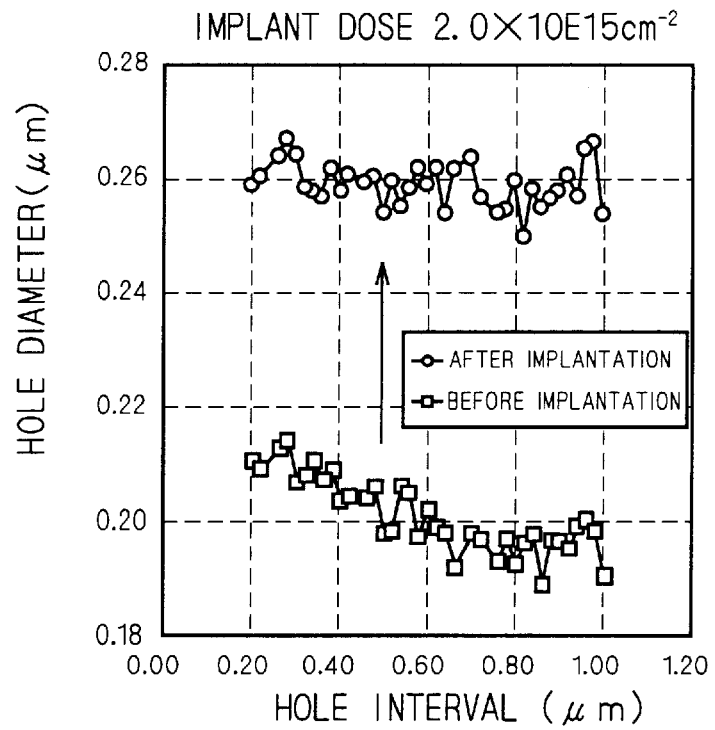
FIG. 9 is a graph showing how pitch dependence is reduced by ion implantation according to the first preferred embodiment.

FIG. 9 is a graph showing how the pitch dependence is reduced by ion implantation according to the first preferred embodiment, the graph illustrating actual experimental results. Here, a laser to be used in a projection aligner is a KrF excimer laser, the lighting conditions are NA=0.65 and $\sigma$=0.50, and a resist to be used has a film thickness of 585 nm. The ionic species to be used is $Ar^+$, the ion implant energy is 50 keV, and the ion implant dose is $2.0 \times 10^{15}$ $cm^{-2}$. As shown in FIG. 9, before ion implantation, the hole diameter mostly decreases with increasing hole interval. That is, the hole diameter before ion implantation has pitch dependence. Such pitch dependence of the hole diameter can be reduced by ion implantation in the resist where the holes are formed, whereby holes having hole diameters nearly independent of the hole intervals, i.e., having no pitch dependence, can be obtained.

Figure 10:
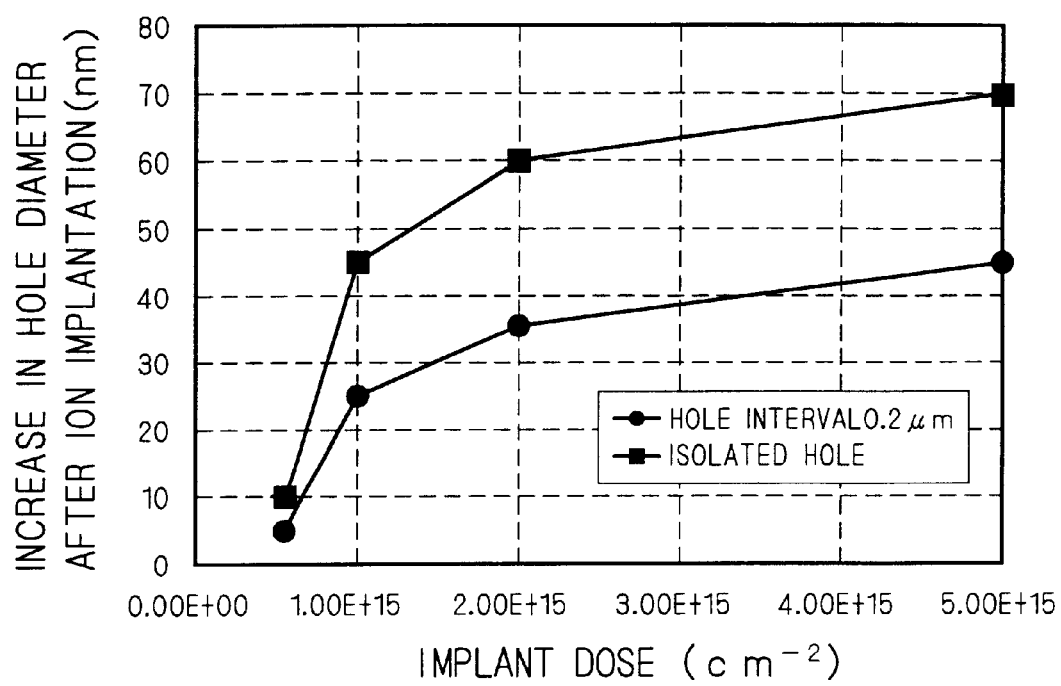
FIG. 10 is a graph showing the amount of increase in the hole diameter for various ion implant doses according to the first preferred embodiment.

FIG. 10 is a graph showing the amount of increase in the hole diameter for various ion implant doses according to the first preferred embodiment. In the drawing, the "isolated hole" indicates a hole with a hole interval of 2.0 $\mu$m. Here, a resist to be used has a film thickness of 585 nm, an ion to be implanted is $Ar^+$, the ion implant energy is 50 keV, and the hole diameter before ion implantation is 0.2 $\mu$m. As shown in FIG. 10, for the ion implant dose of $1.0 \times 10^{15}$ $cm^{-2}$ or more, the amount of increase in the hole diameters of holes with hole intervals of 0.2 $\mu$m and the amount of increase in the hole diameter of the isolated hole increase with an increase in the ion implant dose, and a difference between both the amounts of increase remains nearly unchanged. Therefore, various pitch dependence of the holes can be reduced by controlling the ion implant dose. The amount of increase in the hole diameter can also be controlled by varying the ion implant energy.

While in the first preferred embodiment, the ion used for ion implantation is $Ar^+$ of an inert gas, it may be any other ion of a different inert gas such as $Ne^+$, $Kr^+$, $Xe^+$, or it may be an ion of a gas other than inert gases, such as $N^+$, $N_2^+$, $P^+$, $B^+$, $F^+$, $F_2^+$, $Br^+$, $Cl^+$, $I^+$, $C^+$, $As^+$, $O^+$, or $O_2^+$. The use of an ion of an inert gas, however, minimizes the influence of ion implantation on the interlayer film 2. More specifically, since an ion of an inert gas, such as $Ar^+$, is not coupled to the interlayer film 2, there are less penetration of implanted ions in the resist 1 and less diffusion of implanted ions in the interlayer film 2 through the holes 5a to 5e than when using an ion of a gas other than inert gases. This minimizes degradation in leakage characteristics and reduction of resistance to insulation, both caused by changes in the permittivity of the interlayer film 2 by ion implantation.

Second Preferred Embodiment

Figure 11:
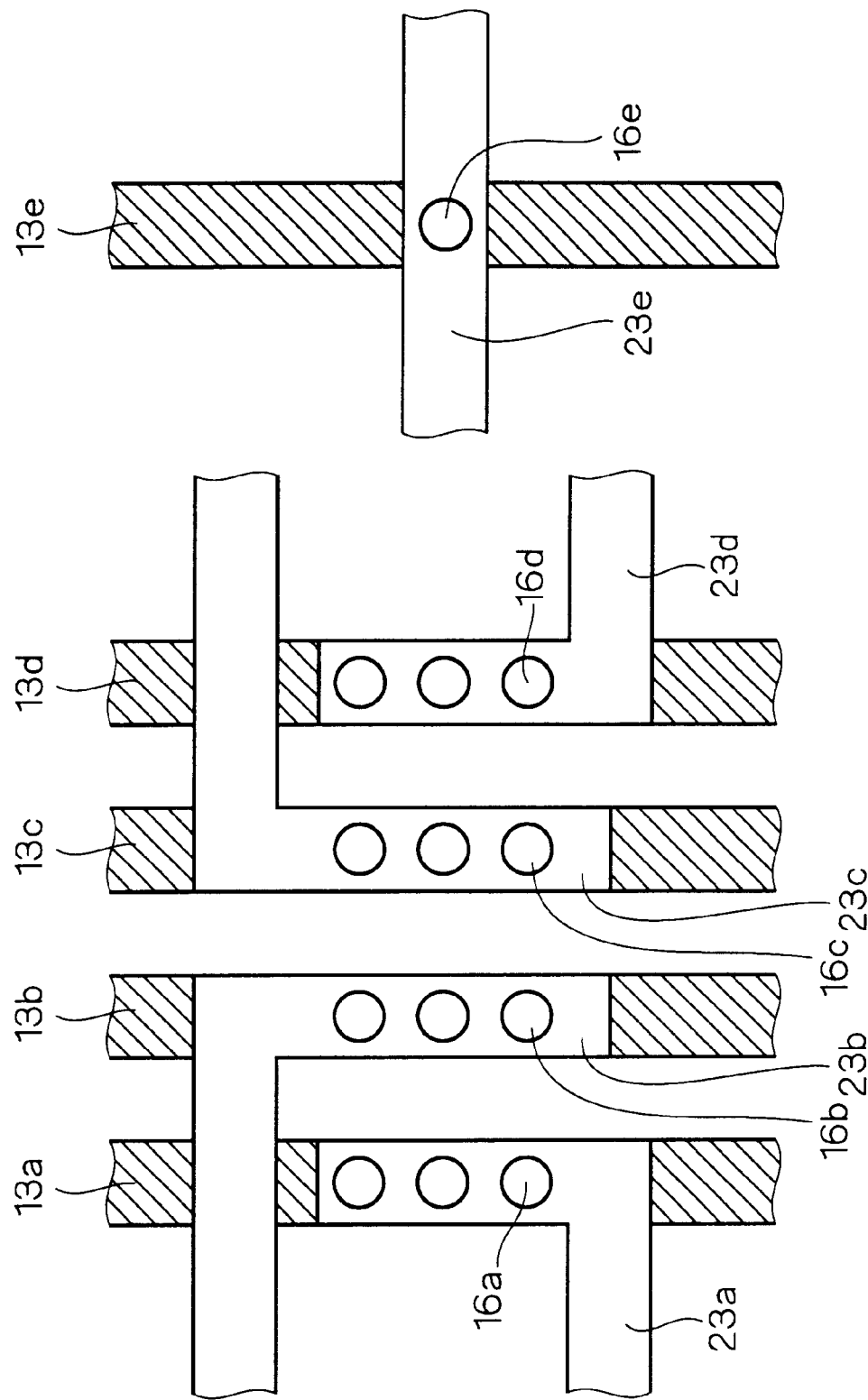
FIG. 11 is a plan view of a wiring structure according to a conventional technique.

FIG. 11 is a plan view of a wiring structure according to a conventional technique, wherein an interlayer film formed between wires 13a–13e and wires 23a–23e is not shown.

In the first preferred embodiment, ion implantation is performed for reducing the pitch dependence of holes in a resist. In a second preferred embodiment of the present invention, on the other hand, ion implantation in a resist as a masking material is performed for the purpose of increasing the diameters of contact holes 16a to 16e which are formed to establish electrical connections between the wires 13a–13e and the wires 23a–23e shown in FIG. 11. To increase the diameters of the contact holes 16a to 16e, it is necessary to increase the hole diameters of holes in a resist. Expressed differently, in the second preferred embodiment, ion implantation in a resist is performed in order to increase the hole diameters of holes formed in a resist.

As shown in FIG. 11, the wires 13a to 13d are located more densely than the wire 13e, and the wires 23a to 23d are located more densely than the wire 23e. The wires 13a and 23a are connected through the contact hole 16a; the wires 13b and 23 are connected through the contact hole 16b; the wires 13c and 23c are connected through the contact hole 16c; the wires 13d and 23d are connected through the contact hole 16d; and the wires 13e and 23e are connected through the contact hole 16e. Hereinafter, the wires 13a to 13e, when discrimination therebetween is unnecessary, may be simply referred to as wires "13". The same can be said of the wires 23a to 23e and the contact holes 16a to 16e.

In general, contact resistance between the wires 13 and 23 is desired to be as low as possible. One of the techniques for reducing the contact resistance is to increase the diameters of the contact holes 16. In order to increase the diameters of the contact holes 16, it is necessary to increase the hole diameters of holes in a resist, which in conventional techniques, has been accomplished by increasing the diameters of holes in a masking material or by increasing the amount of exposure. In this case, the amount of increase in the hole diameters of holes formed on the densely located wires 13a to 13d is nearly equal to the amount of increase in the hole diameters of holes formed on the wire 13e which is located less densely than the wires 13a to 13d. Accordingly, the amount of increase in the diameters of the contact holes 16a to 16d becomes nearly equal to the amount of increase in the diameter of the contact hole 16e. As a result, when the diameters of the contact holes 16 are increased by conventional techniques for reduction of the contact resistance between the wires 13 and 23 in the wiring structure of FIG. 11, the contact hole 16c may connect the densely located wires 13b and 13c, for example, although the wires 13d and 13e are unlikely to be connected.

Figure 12A:
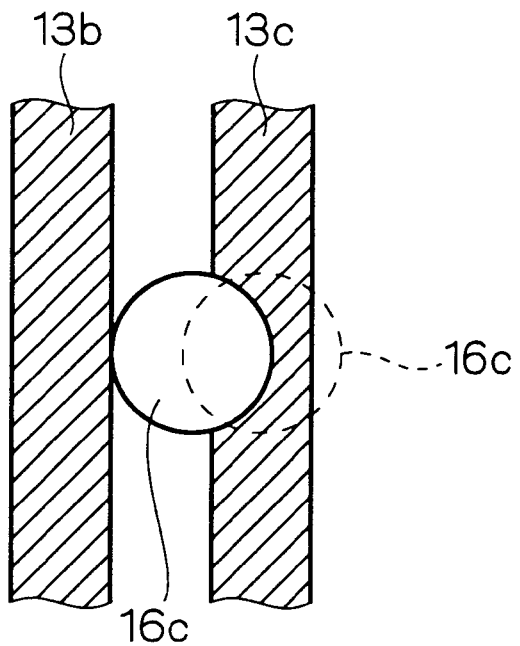
FIGS. 12A and 12B are plan views illustrating how connections between wires are established by enlargement of a contact hole, according to a conventional technique.
Figure 12B:
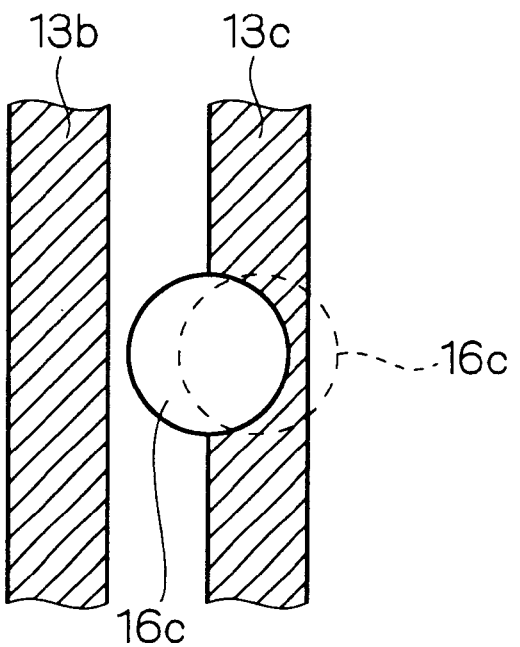

FIGS. 12A and 12B are plan views showing how connection is established between wires by enlargement of a contact hole in conventional techniques. FIG. 12A shows that connection is established between the wires 13b and 13c, and FIG. 12B shows that a complete connection is not established but a leakage current is induced between the wires 13b and 13c.

As shown in FIG. 12A, when the contact hole 16c is improperly positioned, too much increase in the diameter of the contact hole 16c causes the wires 13c and 13b to be connected by the contact hole 16c. The proper position of the contact hole 16c is indicated by the broken line. As shown in FIG. 12B, when the amount of deviation of the contact hole 16c is smaller than that shown in FIG. 12A, a complete connection is not established between the wires 13b and 13c but a leakage current may be induced therebetween through the contact hole 16c.

In the wiring structures shown in FIGS. 11, 12A and 12B, in order to minimize the contact resistance, it is necessary to maximize the diameter of the contact hole 16e connected to the wire 13e without so much increasing the diameters of the contact holes 16a to 16d connected to the densely located wires 13a to 13d. Since the diameters of the contact holes depend on the hole diameters of holes formed in a resist, it is, in other words, necessary to maximize the hole diameters of holes of great pitches without so much increasing the diameters of holes of small pitches. That is, for reduction of the contact resistance, the hole diameter is desired to be increased according to the hole pitch.

FIGS. 13 to 19 are cross-sectional views illustrating a method of manufacturing a semiconductor device according to the second preferred embodiment. This semiconductor device manufacturing method of the second preferred embodiment is for increasing the hole diameter according to the pitch between holes formed in a resist and, as shown in FIGS. 12A and 12B, for reducing the possibility that connection will be established between wires by enlargement of the contact holes.

Figure 13:
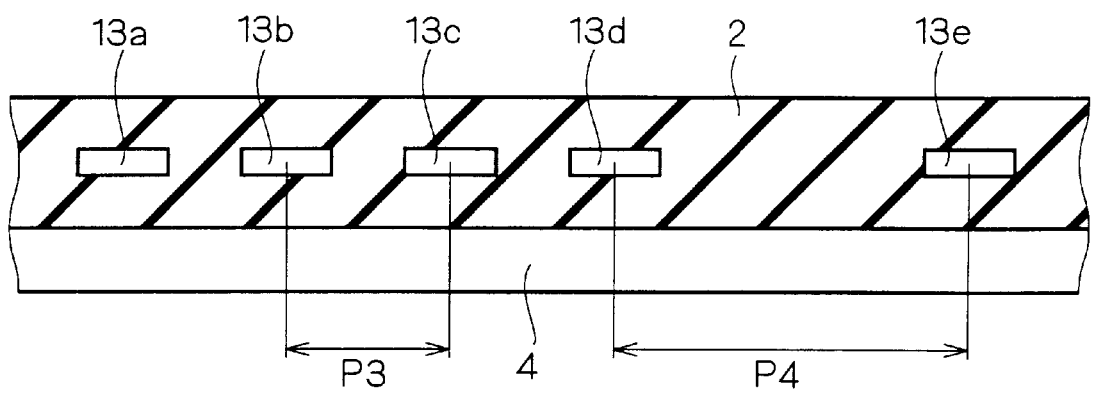
FIGS. 13 to 19 are cross-sectional views illustrating a method of manufacturing a semiconductor device according to a second preferred embodiment of the present invention.

As shown in FIG. 13, the wires 13a to 13e of polysilicon, for example, are formed on the silicon substrate 4 and the interlayer film 2 is formed to cover the wires 13a to 13e. The wires 13a to 13d are located at a distance P3 from each other and the wire 13e is located at a distance P4 from the wire 13d. The distance P4 is greater than the distance P3.

Figure 14:
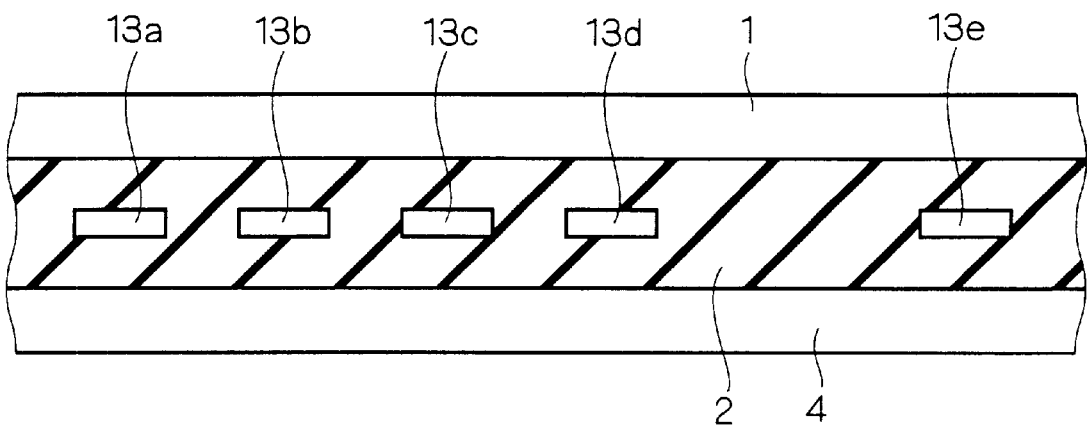
Figure 15:
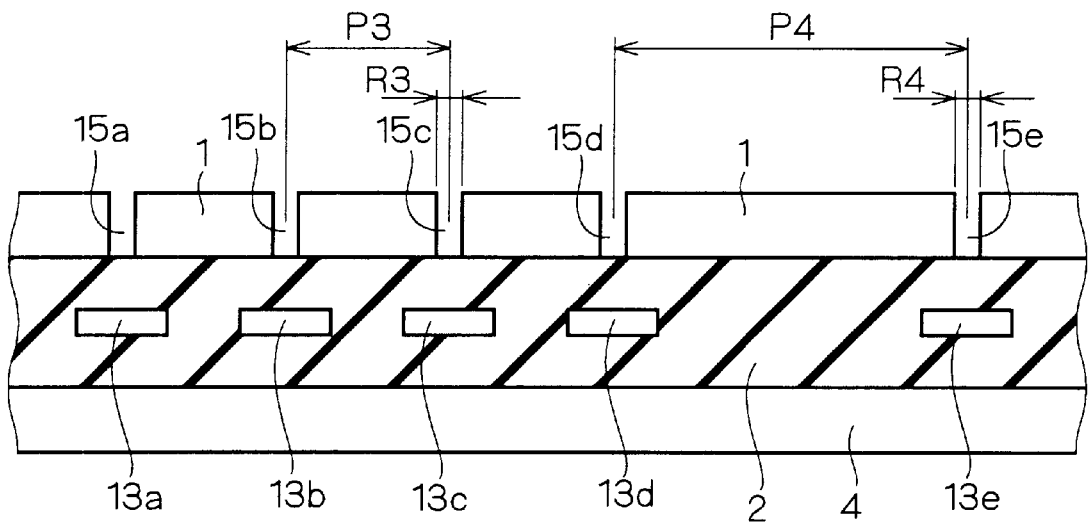

Then, as shown in FIG. 14, the resist 1 of 585 nm thickness, for example, is formed on the interlayer film 2. The resist 1 is, as shown in FIG. 15, exposed and developed to form holes 15a to 15e in positions corresponding to the wires 13a to 13e, respectively. Since the holes 15a to 15d are positioned in correspondence to the wires 13a to 13d, the hole pitch of the holes 15a to 15d equals to the distance P3, while since the hole 15e is positioned in correspondence to the wire 13e, the hole pitch of the hole 15e equals to the distance P4. That is, the hole pitch of the holes 15a to 15d is smaller than that of the hole 15e. The hole diameters R3 of the holes 15a to 15d are nearly equal to the hole diameter R4 of the hole 15e.

Figure 16:
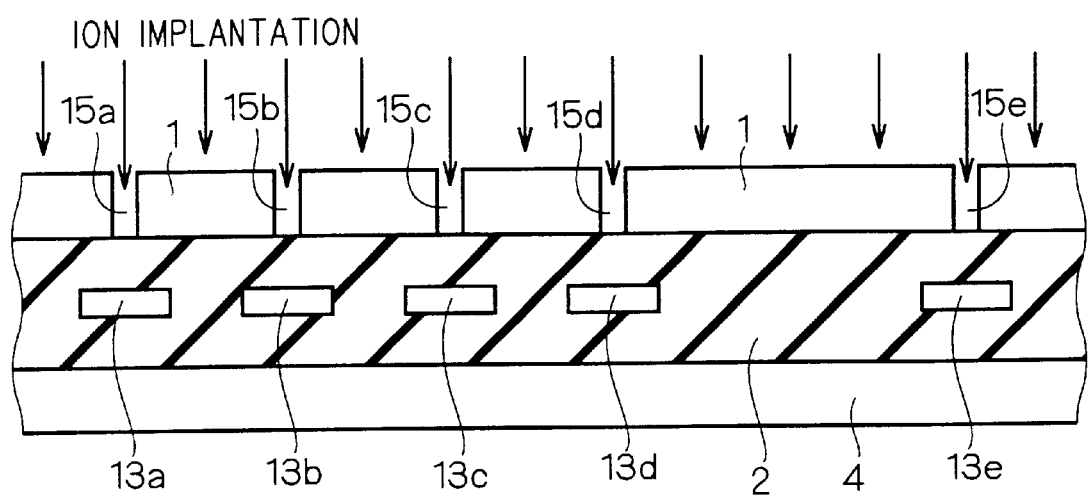
Figure 17:
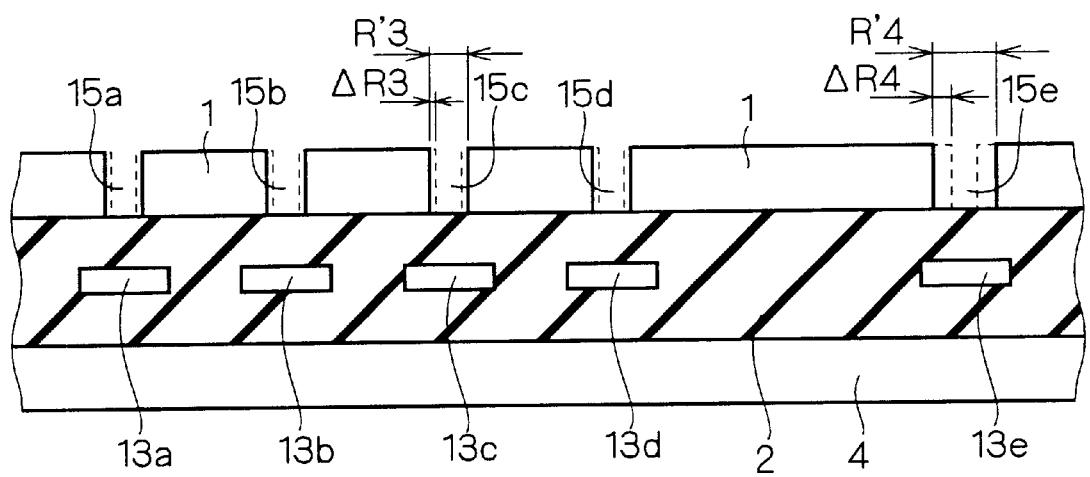

Next, as shown in FIG. 16, Ar$^+$ ions of an inert gas are implanted vertically into the surface of the resist 1, for example, at an energy of 50 keV at a dose of $5.0 \times 10^{15}$ cm$^{-2}$. The ion implantation in the resist 1, as shown in FIG. 17, shrinks the resist 1 and increases the hole diameters R3 of the holes 15a to 15d to R'3 and the hole diameter R4 of the hole 15e to R'4. At this time, as has been previously described with reference to FIG. 5, the amount of increase ΔR3 in the hole diameters R3 of the holes 15a to 15d of small hole pitches is smaller than the amount of increase ΔR4 in the hole diameter R4 of the hole 15e of a great hole pitch. That is, the hole diameter can be increased according to the hole pitch by ion implantation. Consequently, the hole diameters R'3 of the holes 15a to 15d after ion implantation become smaller than the hole diameter R'4 of the hole 15e.

Figure 18:
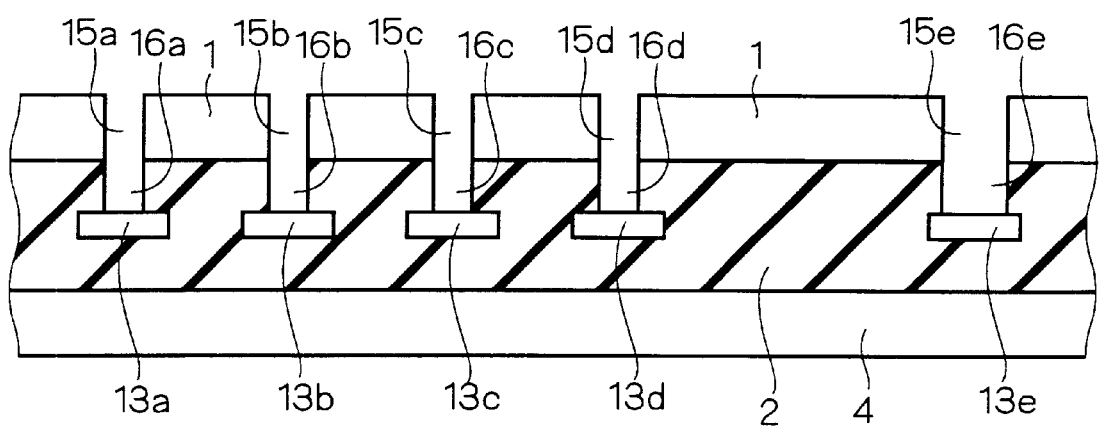
Figure 19:
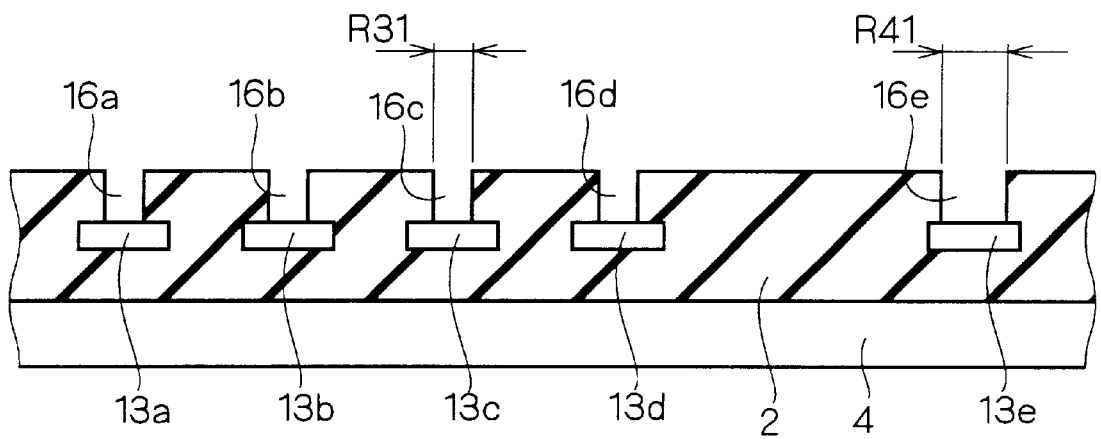

Using the resist 1 as a masking material, as shown in FIG. 18, the interlayer film 2 is etched to form the contact holes 16a to 16e. The contact holes 16a to 16e are connected to the wires 13a to 13e, respectively. The resist 1 is then removed as shown in FIG. 19, which completes the formation of the contact holes 16a to 16e. At this time, the diameters R31 of the contact holes 16a to 16d are smaller than the diameter R41 of the contact hole 16e. Thus, even if the contact hole 16c connected to the densely located wire 13c, for example, is improperly positioned, it is unlikely that the wires 13c and 13b will be connected by the contact hole 16c.

In the method of manufacturing a semiconductor device according to the second preferred embodiment, the hole diameter can be increased according to the hole pitch. Therefore, it is possible to increase the diameters of the holes 15a to 15e while maintaining insulation between the holes 15a to 15d of small hole pitches.

While in the second preferred embodiment, the distance between each of the holes 15a to 15e and the distance between the holes 15e and 15d are defined by the hole pitch, it may be defined by the hole interval. In this case, the hole interval for the holes 15a to 15d becomes smaller than that for the hole 15e. In the semiconductor device manufacturing method of the second preferred embodiment, therefore, the hole diameter can be increased according to the hole pitch or the hole interval, i.e., according to the "pitch".

Third Preferred Embodiment

In a third preferred embodiment of the present invention, ion implantation in a resist is performed for achieving hole diameters larger than before, when forming holes of 0.5-μm or less hole pitches.

FIGS. 20 to 27 are cross-sectional views for explaining a self-aligned contact process (hereinafter referred to as a "SAC" process) in conventional techniques. The SAC process is a kind of techniques for forming contact holes.

Figure 20:
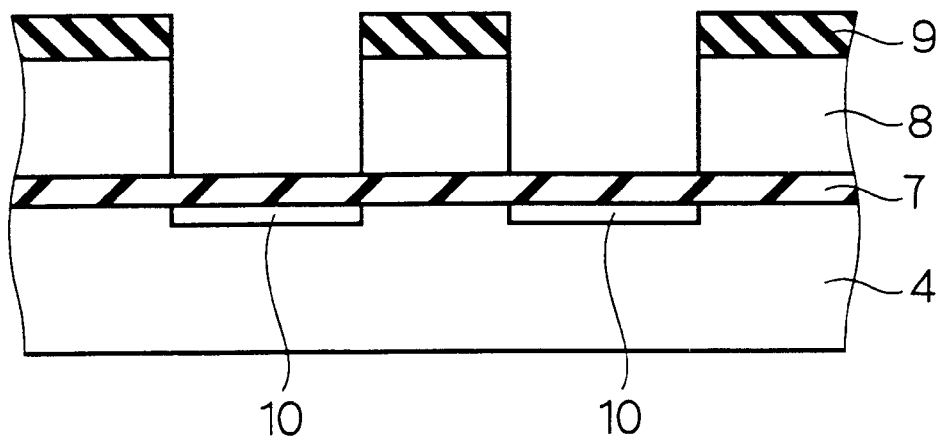
FIGS. 20 to 27 are cross-sectional views for explaining a SAC process.

As shown in FIG. 20, a gate oxide film 7 is formed on the silicon substrate 4 and gates 8 of polysilicon, for example, are formed on the gate oxide film 7. Further, a nitride film 9 is formed on the gates 8. In the surface of the silicon substrate 4 between the gates 8, active regions 10 are formed.

Figure 21:
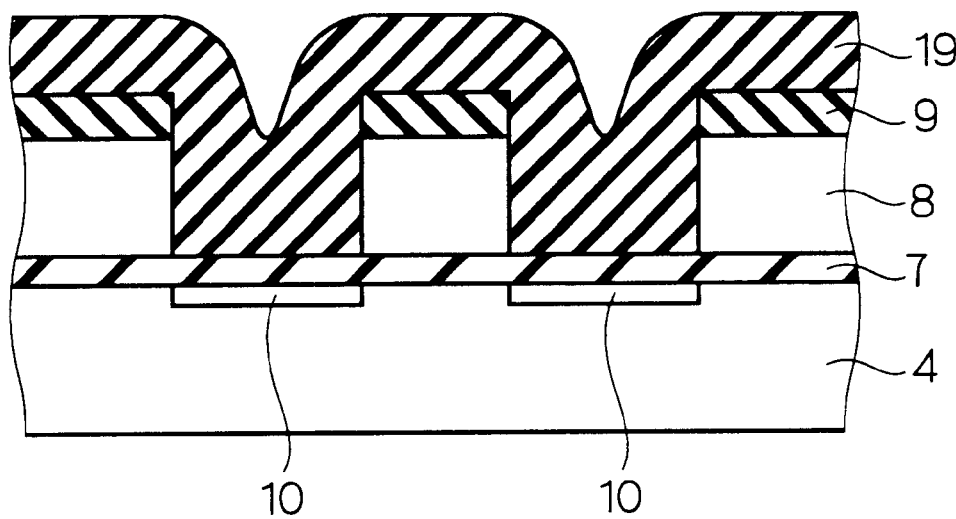
Figure 22:
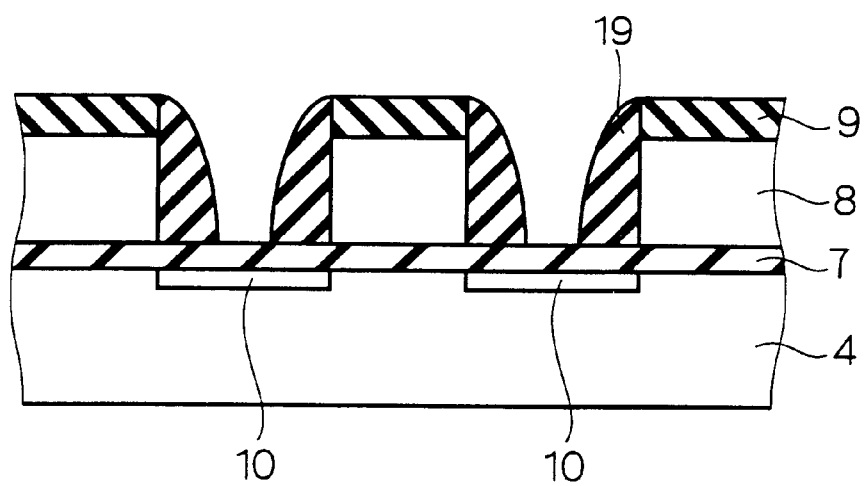

As shown in FIG. 21, a nitride film 19 is formed to cover the gate oxide film 7, the gates 8, and the nitride film 9. As shown in FIG. 22, the nitride film 19 is etched back and the remaining nitride film 19 form sidewalls.

Figure 23:
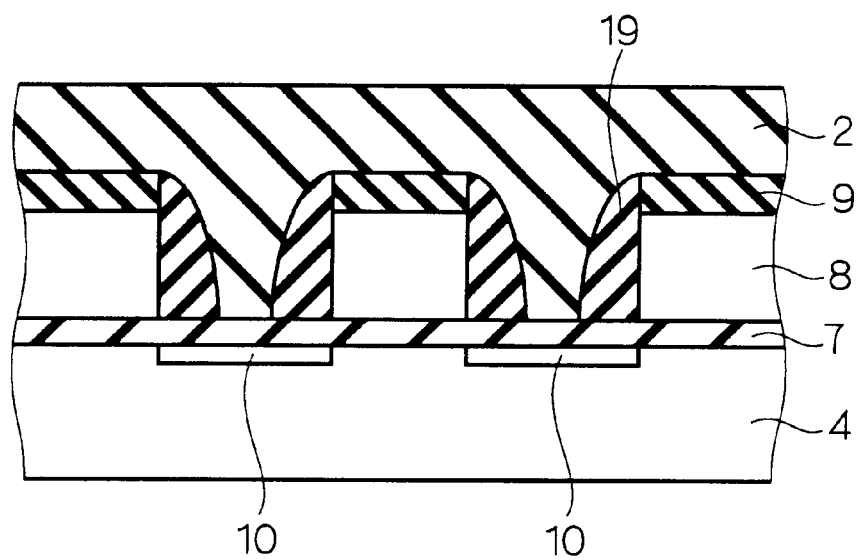
Figure 24:
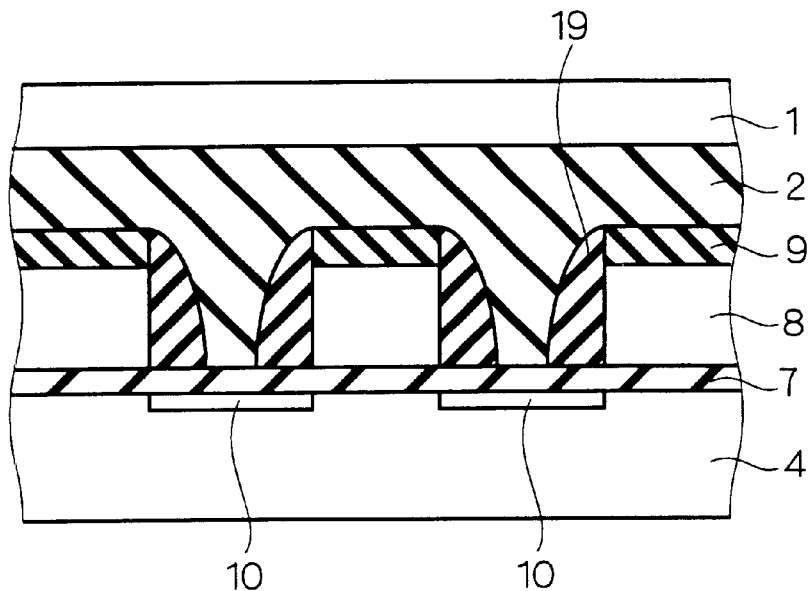

Then, as shown in FIG. 23, the interlayer film 2 of $SiO_2$ is formed to cover the gate oxide film 7 and the nitride films 9 and 19. On the interlayer film 2, the resist 1 is formed as shown in FIG. 24.

Figure 25:
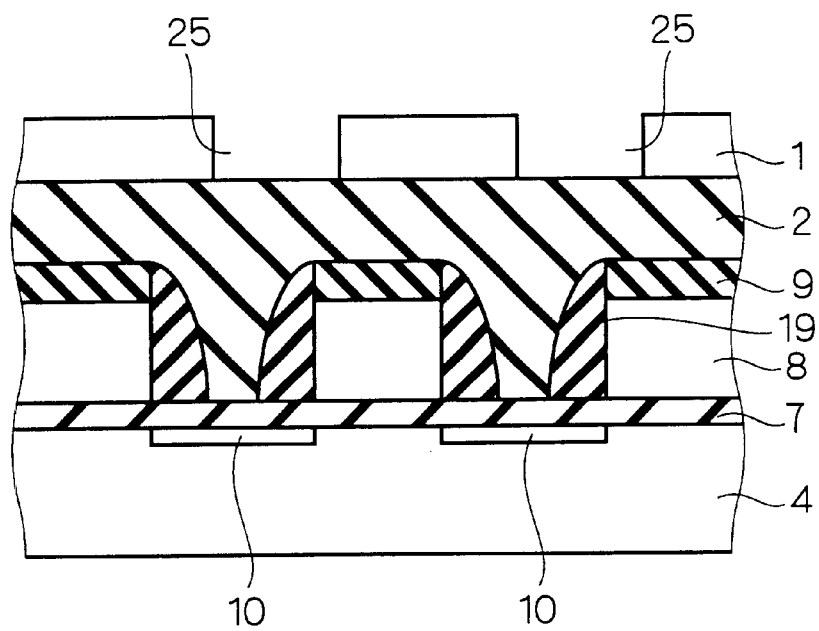
Figure 26:
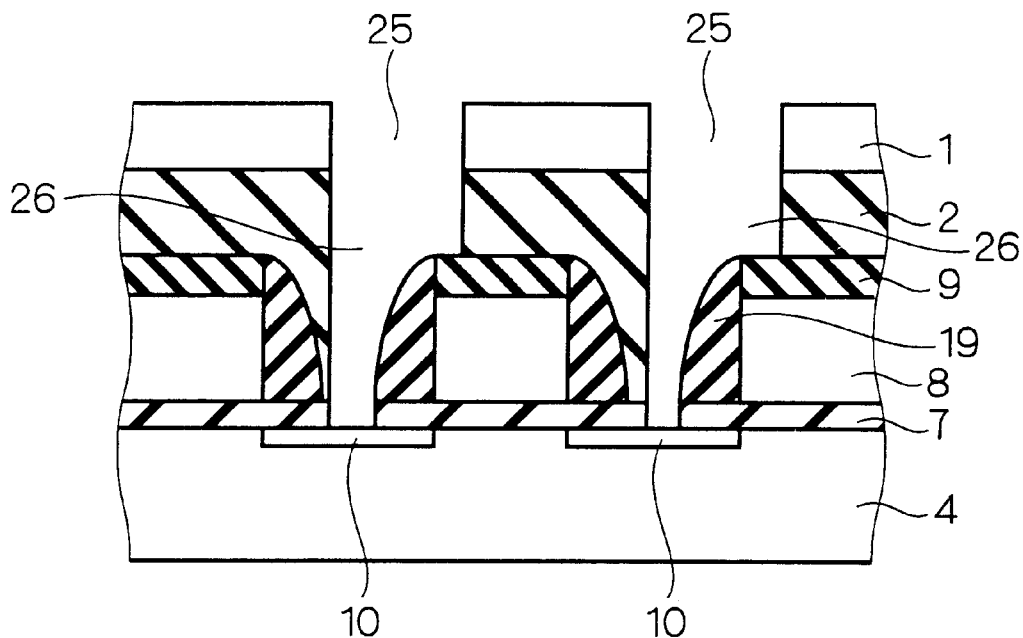
Figure 27:
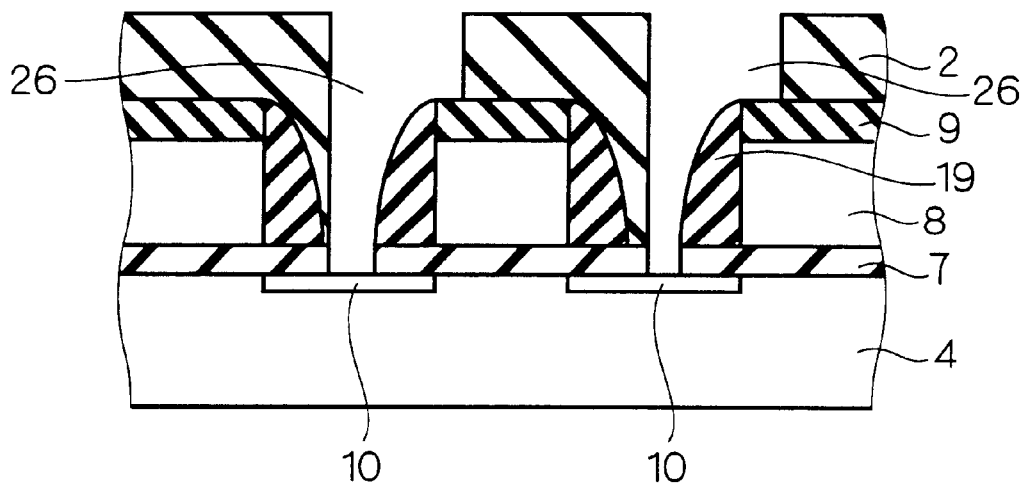

The resist 1 is then, as shown in FIG. 25, exposed and developed to form holes 25. Using the resist 1 as a masking material, as shown in FIG. 26, etching is performed to form contact holes 26 reaching the active regions 10. At this time, the etch rate of the nitride films 9 and 19 is considerably lower than that of the interlayer film 2 and the gate oxide film 7; therefore, the contact holes 26 are formed almost without etching the nitride films 9 and 19. From this, even if the holes 25 are formed somewhat out of position, contact with the active regions 10 can be established while maintaining insulation to the gates 8. The resist 1 is then removed as shown in FIG. 27, which completes the formation of the contact holes 26.

FIG. 28 is a cross-sectional view for explaining problems of the SAC process in conventional techniques. As shown in FIG. 28, in the formation of the contact holes 26 by the above SAC process, when the holes 25 in the resist 1 have diameters smaller than predetermined values and deviate noticeably from their predetermined positions, the contact holes 26 may not be able to contact with the active regions 10. Further, even if the contact between the contact holes 26 and the active regions 10 can be established, desired contact resistance may not be achieved because of inability to have a sufficient area of contact. In the SAC process, therefore, the hole diameters of the holes 25 are desired to be large enough.

The SAC process is often used for forming contact holes having center-to-center distances of 0.5 μm or less. In order to form such contact holes, the hole pitch between holes formed in a resist also need to be 0.5 μm or less. In the formation of holes of 0.5-μm or less hole pitches, if the dimensions of holes in a masking material or the amount of exposure is increased to increase the hole diameter, a reduction in the resistance of resist to etching becomes a problem. For example, if the hole diameter is increased to more than half of the hole pitch, a reduction in the resistance of resist to etching becomes pronounced.

Figure 29A:
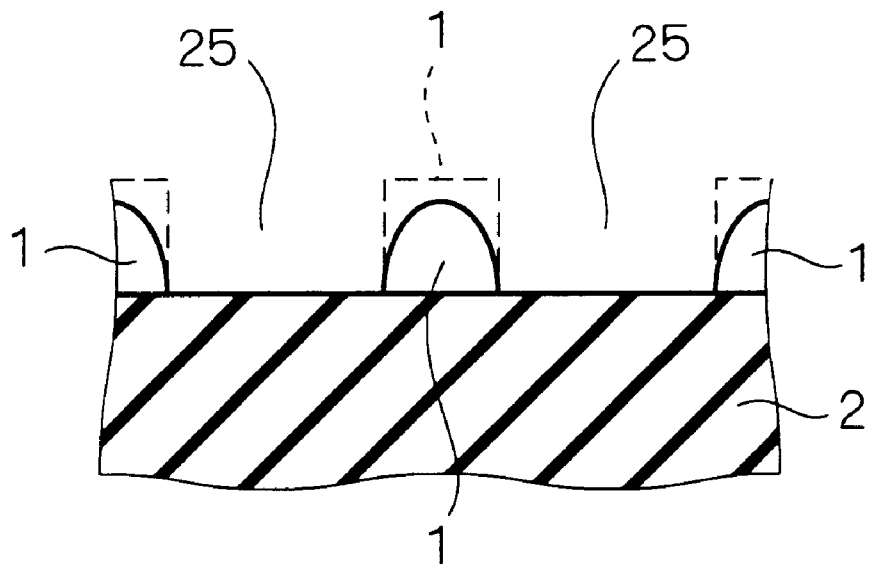
FIGS. 29A and 29B are cross-sectional views illustrating how resistance of a resist to etching is reduced.
Figure 29B:
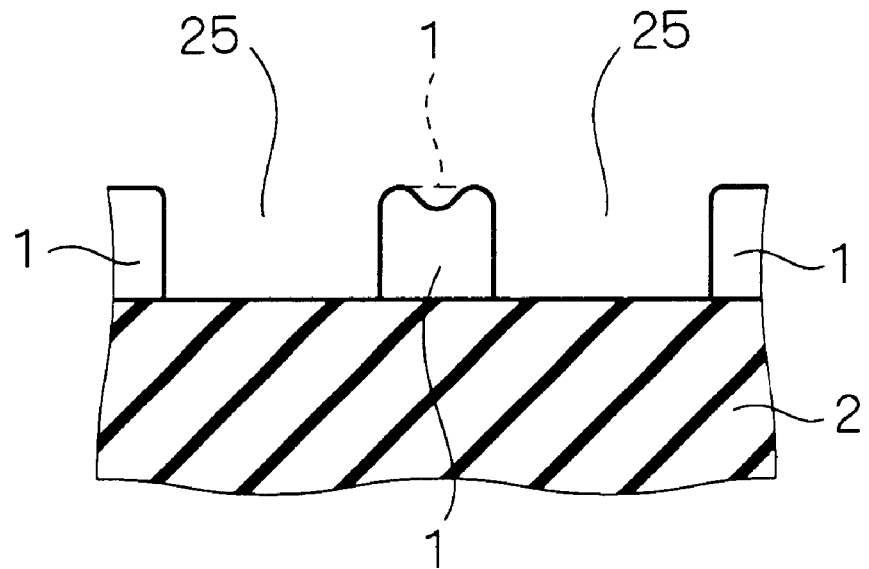

FIGS. 29A and 29B are cross-sectional views showing such a reduction in the resistance to etching. FIG. 29A is a cross-sectional view illustrating film thickness loss occurring in the resist 1, and FIG. 29B is a cross-sectional view illustrating formation of side lobes in the resist 1.

As shown in FIG. 29A, in the formation of the holes 25 of 0.5-μm or less hole pitches, if the hole diameters of the holes 25 are made to not less than half of the hole pitches, the upper portion of the resist 1 may be removed by development and thereby the resistance of the resist 1 to etching may be reduced. This phenomenon is called "film thickness loss."

Further, as shown in FIG. 29B, in the formation of the holes 25 of 0.5-μm or less hole pitches, if the hole diameters of the holes 25 are made to not less than half of the hole pitches, the upper surface of the resist 1 may be recessed and thereby the resistance of the resist 1 to etching may be reduced. This phenomenon is called "side lobes."

Figure 30:
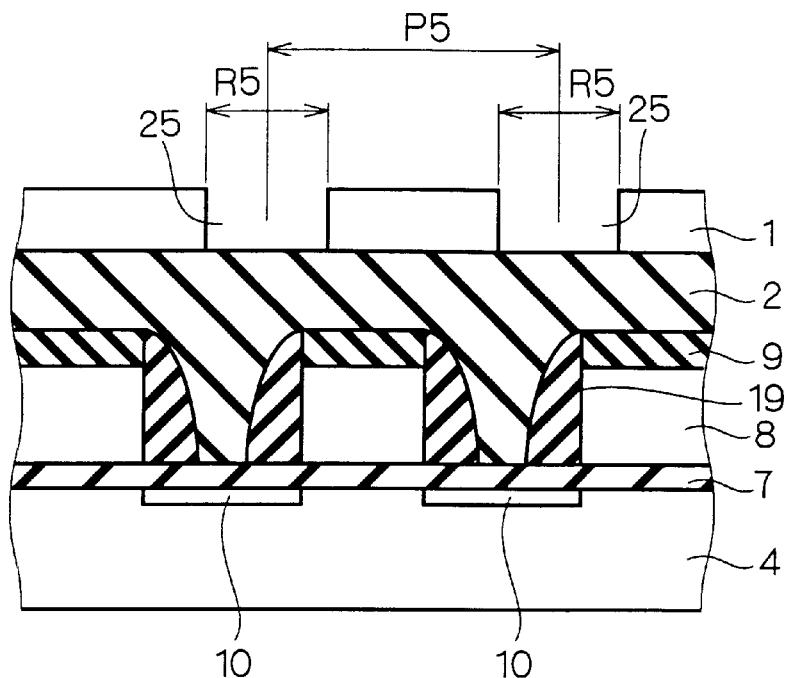

A method of manufacturing a semiconductor device according to the third preferred embodiment is an effective manufacturing method for increasing the hole diameter to, for example, not less than half of the hole pitch while preventing the occurrence of film loss and side lobes to a minimum, in formation of holes of 0.5-μm or less hole pitches. FIGS. 30 to 34 illustrate the semiconductor device manufacturing method of the third preferred embodiment. Steps prior to the step of FIG. 30 are identical to those of FIGS. 20 to 24 described above.

As shown in FIG. 30, the holes 25 of holes pitches P5 and hole diameters R5 are formed in the resist 1. The hole pitches P5 are not more than 0.5 μm. The hole diameters R5 are set to be smaller than the desired hole diameter (target diameter).

Figure 31:
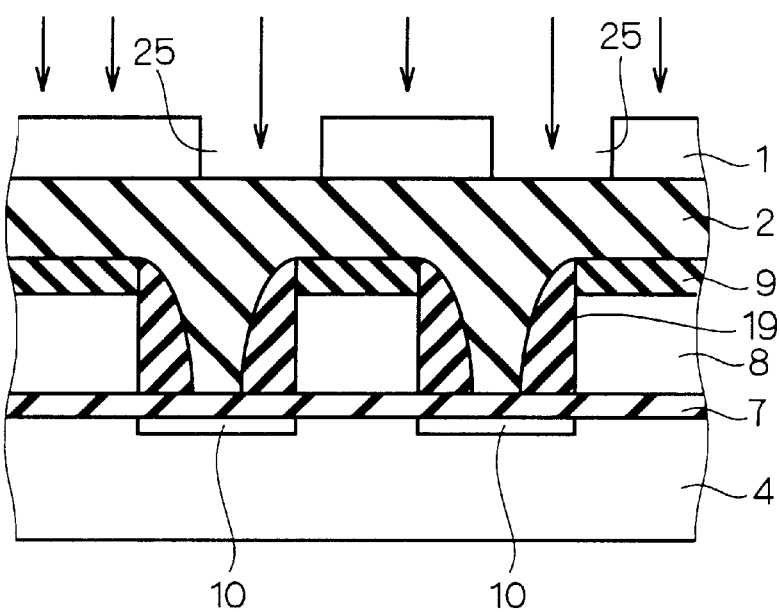
Figure 32:
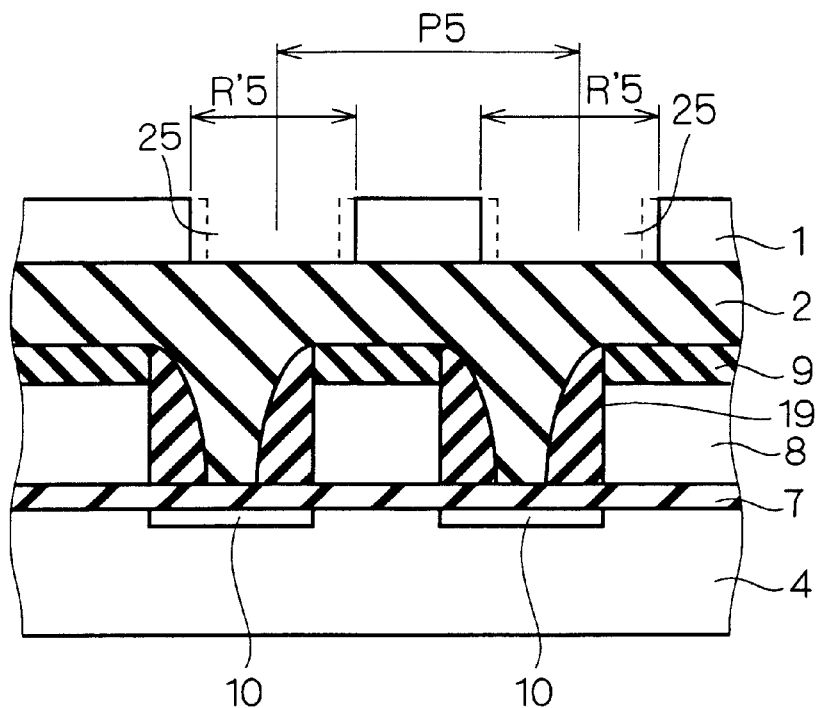
Figure 33:
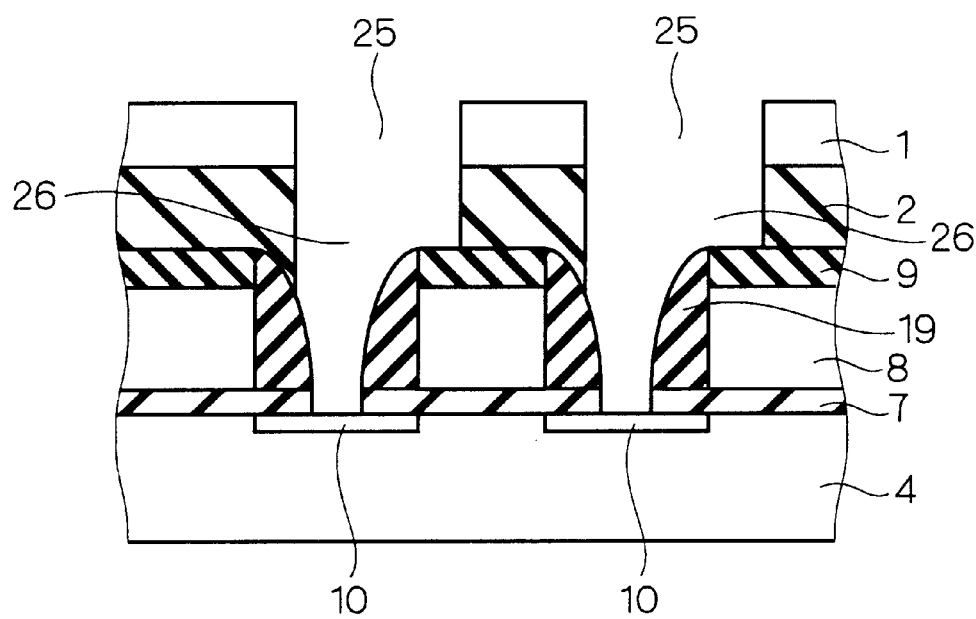

Then, as shown in FIG. 31, $Ar^+$ ions of an inert gas are implanted vertically into the surface of the resist 1, for example, at an energy of 50 keV at a dose of $5.0 \times 10^{15}$ cm$^{-2}$. The ion implantation in the resist 1, as shown in FIG. 32, shrinks the resist 1 and increases the hole diameters R5 of the holes 25 to R'5. At this time, the enlarged hole diameter R'5 is equivalent to the desired hole diameter (target diameter). Using the resist 1 as a masking material, as shown in FIG. 33, etching is performed to form the contact holes 26 reaching the active regions 10 formed in the surface of the silicon substrate 4. The resist 1 is then removed as shown in FIG. 34, which completes the formation of the contact holes 26.

As above described, the semiconductor device manufacturing method of the third preferred embodiment is an effective manufacturing method for forming holes of 0.5-μm or less hole pitches. In order to minimize the occurrence of film loss and side lobes, at first, the holes 25 of smaller hole diameters than the desired value are formed and then the hole diameters of the holes 25 are increased to the desired value by ion implantation. This inhibits a reduction in the resistance of resist to etching.

Fourth Preferred Embodiment

Figure 36:
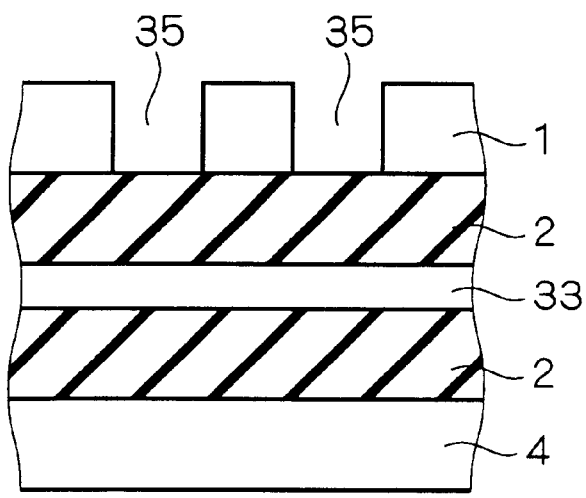
Figure 37:
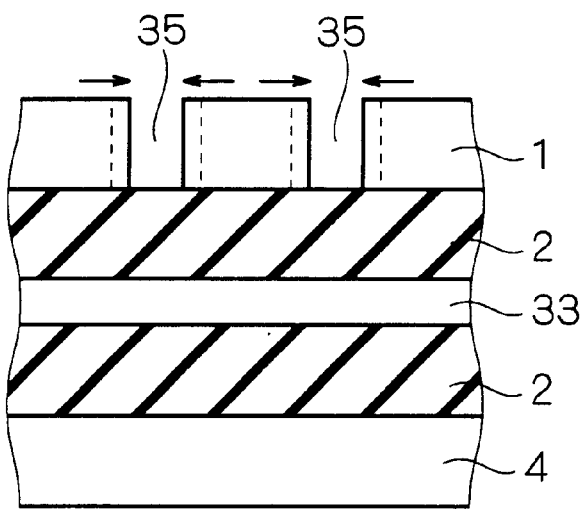

Conventional techniques provide various processing for reduction of the hole diameter (hereinafter referred to as "hole-diameter reduction processing"). Such reduction processing is usually a technique for use in forming contact holes between densely located wires. FIGS. 35 to 37 are cross-sectional views for explaining a thermal flow process in conventional techniques, and FIGS. 38 to 41 are cross-sectional views for explaining a RELACS process in conventional techniques. The thermal flow process or the RELACS process is a kind of the above hole-diameter reduction processing. The details on the thermal flow process are described for example in the "Proceeding. 56$^{th}$ JSAP Autumn Meeting," by K. Hayano, N. Hasegawa, and H. Murai, 26p-ZS-12 (1995) and the details on the RELACS process are described for example in the "Proceeding of SPIE Advances in Resist Technology and Processing," by T. Kanda, H. Tanaka, and Y. Kinoshita, XVII, Vol. 3999, p.881 and later, (2000).

First, the thermal flow process will be set forth in brief. As shown in FIG. 35, a wiring layer 33 of polysilicon is formed on the silicon substrate 4 and the interlayer film 2 of $SiO_2$ is formed to cover the wiring layer 3. The resist 1 is formed on the interlayer film 2.

The resist 1 is then, as shown in FIG. 36, exposed and developed to form holes 35. As shown in FIG. 37, thermal treatment in a temperature range of about 120–150° C. softens the resist 1, causing resist deformation by thermal flow. This reduces the hole diameters of the holes 35, resulting in the formation of the holes 35 having small hole diameters.

Figure 38:
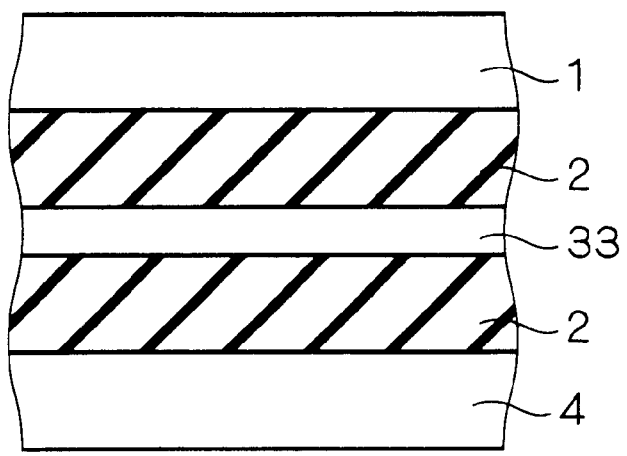
FIGS. 38 to 41 are cross-sectional views for explaining a RELACS process.
Figure 39:
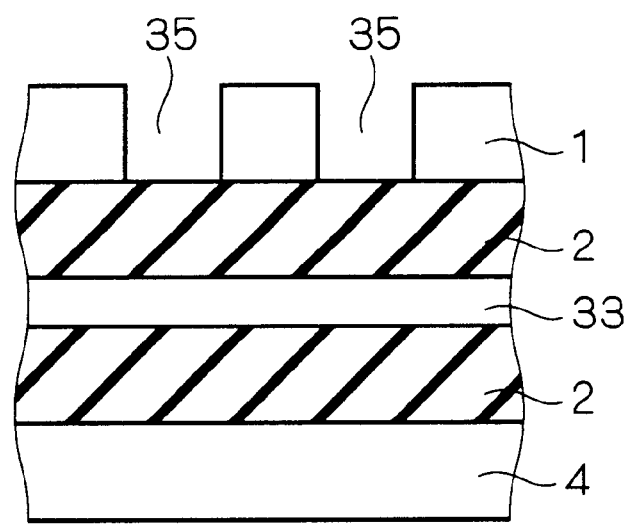

Next, the RELACS process will be set forth in brief. As shown in FIG. 38, the wiring layer 33 of polysilicon is formed on the silicon substrate 4 and the interlayer film 2 of $SiO_2$ is formed to cover the wiring layer 33. Then, the resist 1 is formed on the interlayer film 2. The resist 1 here is a chemically amplified resist. The resist 1 is then, as shown in FIG. 39, exposed and developed to form the holes 35. More specifically, upon exposure, oxygen is generated in the chemically amplified resist 1. The oxygen in the resist 1 causes a chemical reaction and changes solubility characteristics of a developing solution. Consequently, the holes 35 are formed.

Figure 40:
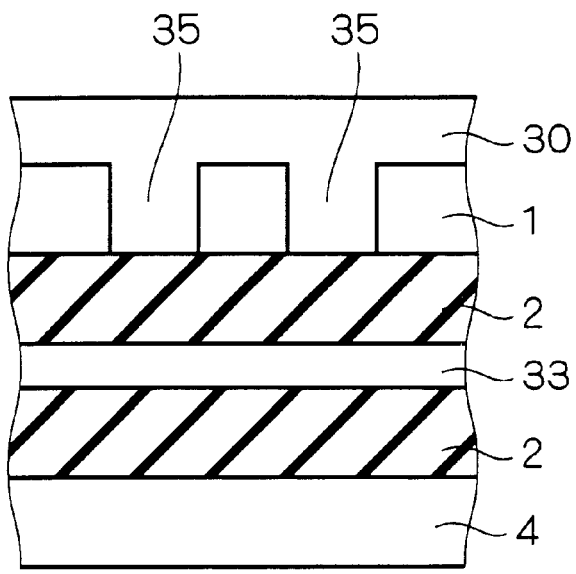
Figure 41:
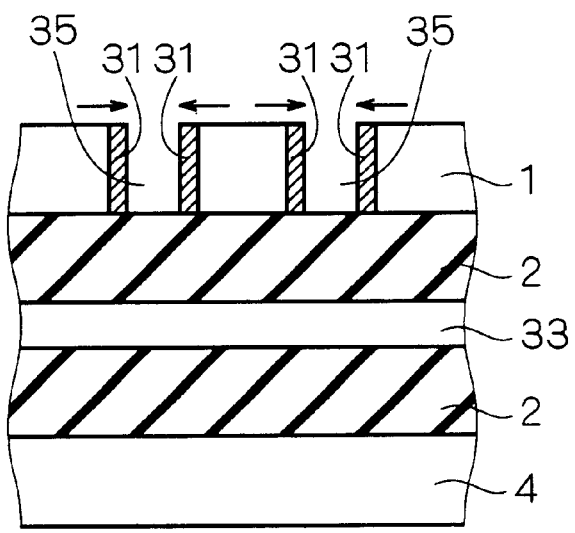

Then, as shown in FIG. 40, a predetermined solvent 30 which reacts and bonds with oxygen is formed on the interlayer film 2 to cover the resist 1 and thermal treatment is carried out. Since in the step of FIG. 39, oxygen remains in the vicinity of the surface of the resist 1 where the holes 35 are formed, the oxygen as shown in FIG. 41 chemically reacts and bonds with the solvent to produce a compound 31 on the surface of the resist 1 where the holes 35 are formed. Consequently, the hole diameters of the holes 35 are reduced. The thermal flow process and the RELACS process can control the amount of reduction in the hole diameter by controlling a bake temperature during the thermal treatment.

The hole-diameter reduction processing, such as the thermal flow process or the RELACS process, develops pitch dependence of the hole diameter. If the hole diameters before the hole-diameter reduction processing are nearly uniform, the amount of reduction in the hole diameters of holes of great pitches is larger than that in the hole diameters of holes of small pitches. Thus, the hole diameter decreases as the pitch increases.

In the thermal flow process, since there is a larger amount of resist around holes of great pitches than around holes of small pitches, the amount of resist deformation by thermal flow around holes of great pitches becomes larger than that around holes of small pitches. From this, the hole diameters of holes of great pitches decrease by a larger amount than the hole diameters of holes of small pitches.

The RELACS process is a process in which remaining oxygen in a resist reacts with a solvent. Since there is a larger amount of resist around holes of great pitches than around holes of small pitches, oxygen can be easily supplied from the resist around the holes of great pitches. From this, the hole diameters of holes of great pitches decrease by a larger amount than the hole diameters of holes of small pitches.

Now, in conventional techniques, reduction in the film thickness of a resist is required for formation of holes of small pitches in the resist. Reducing the film thickness of the resist, however, reduces the resistance of resist to etching. In conventional techniques, therefore, ion implantation is performed on the resist to improve the resistance to etching. Such ion implantation in resist, however, as has been previously described, causes a problem of increasing and varying the hole diameters of holes formed in the resist. Further, since the hole diameters of holes of great pitches increase by a larger amount than the hole diameters of holes of small pitches, if the resist has a plurality of holes of the same hole diameter located with different pitches, ion implantation can cause a problem of producing a difference among the hole diameters of the holes. Here, how the resistance to etching is improved by ion implantation in resist is disclosed for example in Japanese Patent Application Laid-Open No. 10-41309 (1998).

A method of manufacturing a semiconductor device according to the fourth preferred embodiment is an effective manufacturing method for achieving excellent resistance to etching and reducing variations among the hole diameters by carrying out the aforementioned hole-diameter reduction processing, which develops pitch dependence, and ion implantation.

FIGS. 42 to 46 are cross-sectional views illustrating the semiconductor device manufacturing method of the fourth preferred embodiment. As show in FIG. 42, the wiring layer 33 of polysilicon is formed on the silicon substrate 4 and the interlayer film 2 of $SiO_2$ is formed to cover the wiring layer 33. Then, the resist 1 is formed on the interlayer film 2.

Figure 43:
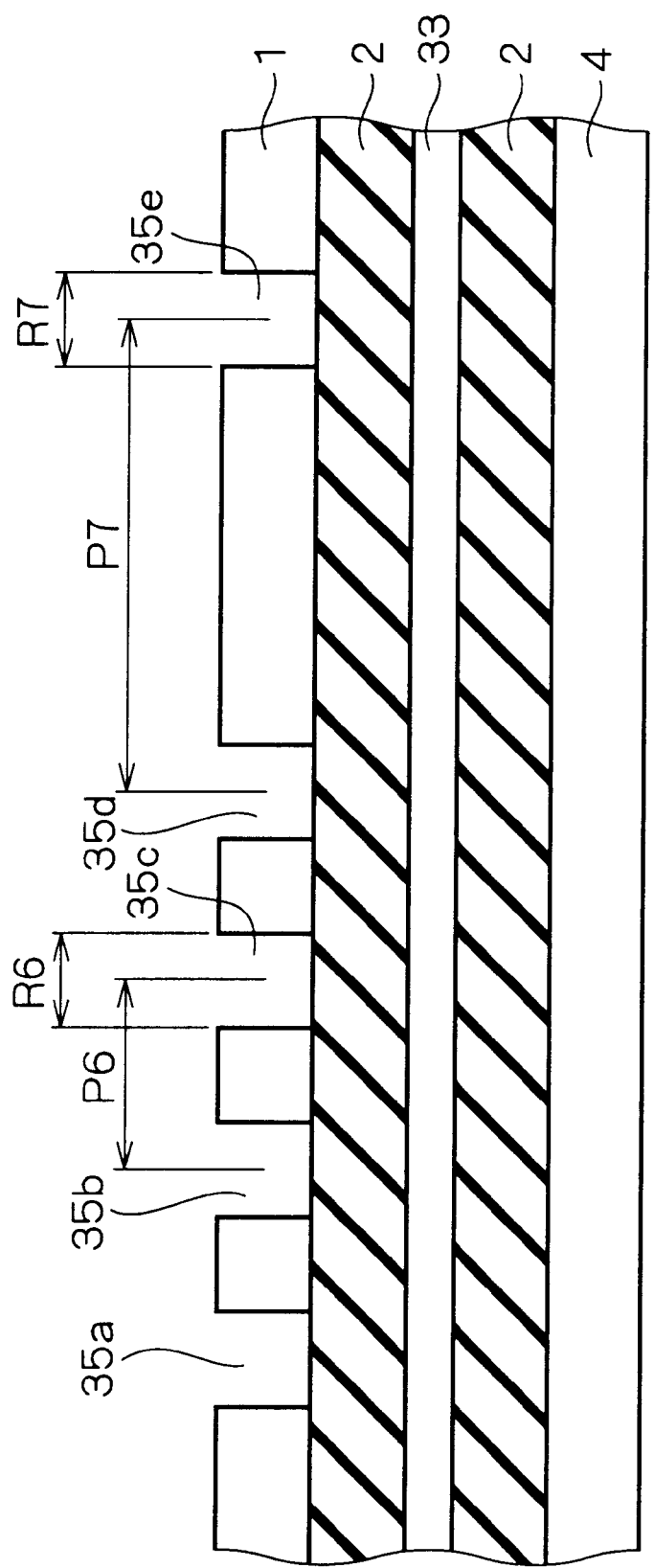
Figure 44:
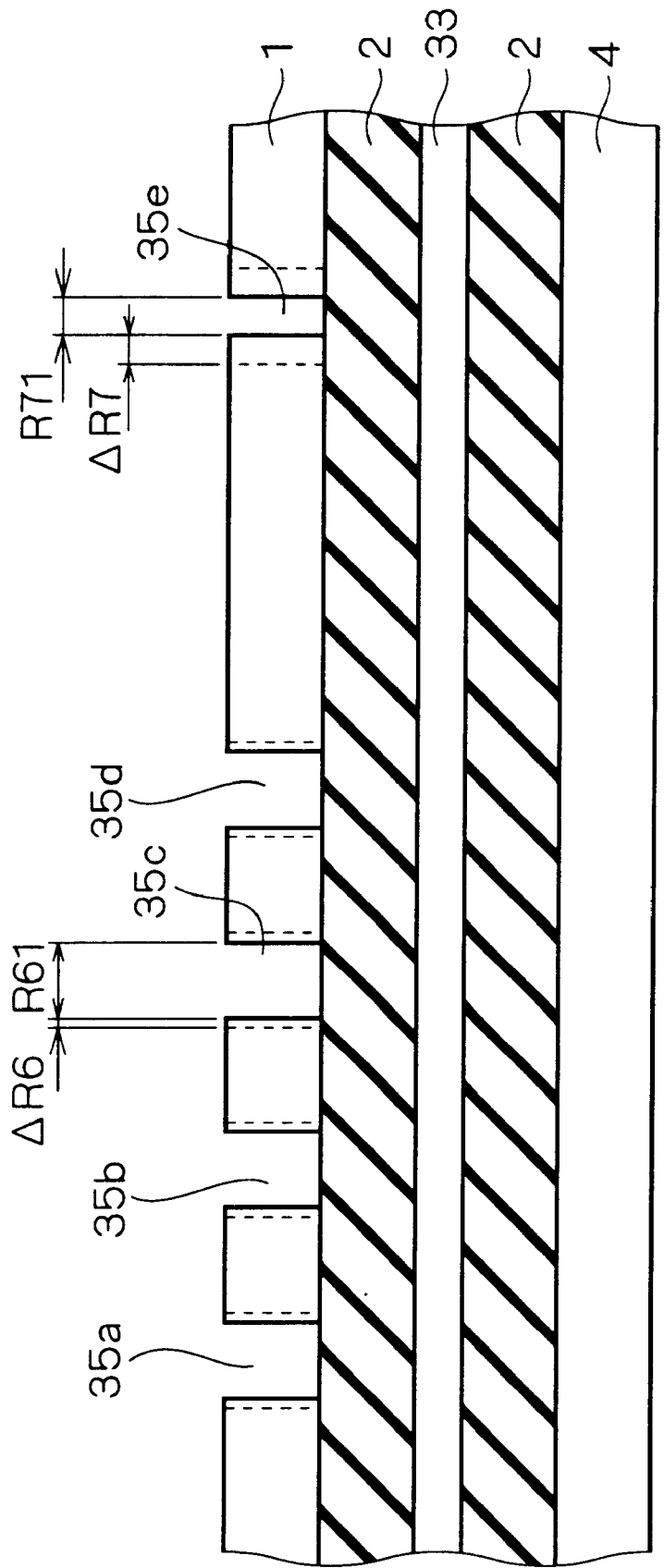

The resist 1 is, as shown in FIG. 43, exposed and developed to form in the resist 1 holes 35a to 35d of hole pitches P6 and a hole 35e of a hole pitch P7 greater than the hole pitch P6. The hole diameters R6 of the holes 35a to 35d are nearly equal to the hole diameter R7 of the hole 35e. Then, as shown in FIG. 44, the aforementioned hole-diameter reduction processing such as the thermal flow process or the RELACS process is carried out. Consequently, the hole diameters R6 of the holes 35a to 35d of small hole pitches are reduced to R61 and the hole diameter R7 of the hole 35e of a great hole pitch is reduced to R71. The reduction processing develops the pitch dependence of the holes. Therefore, the amount of reduction $\Delta R7$ in the hole diameter of the hole 35e is larger than the amount of reduction $\Delta R6$ in the hole diameters of the holes 35a to 35d and consequently, the hole diameter R71 of the hole 35e becomes smaller than the hole diameters R61 of the holes 35a to 35d.

Figure 45:
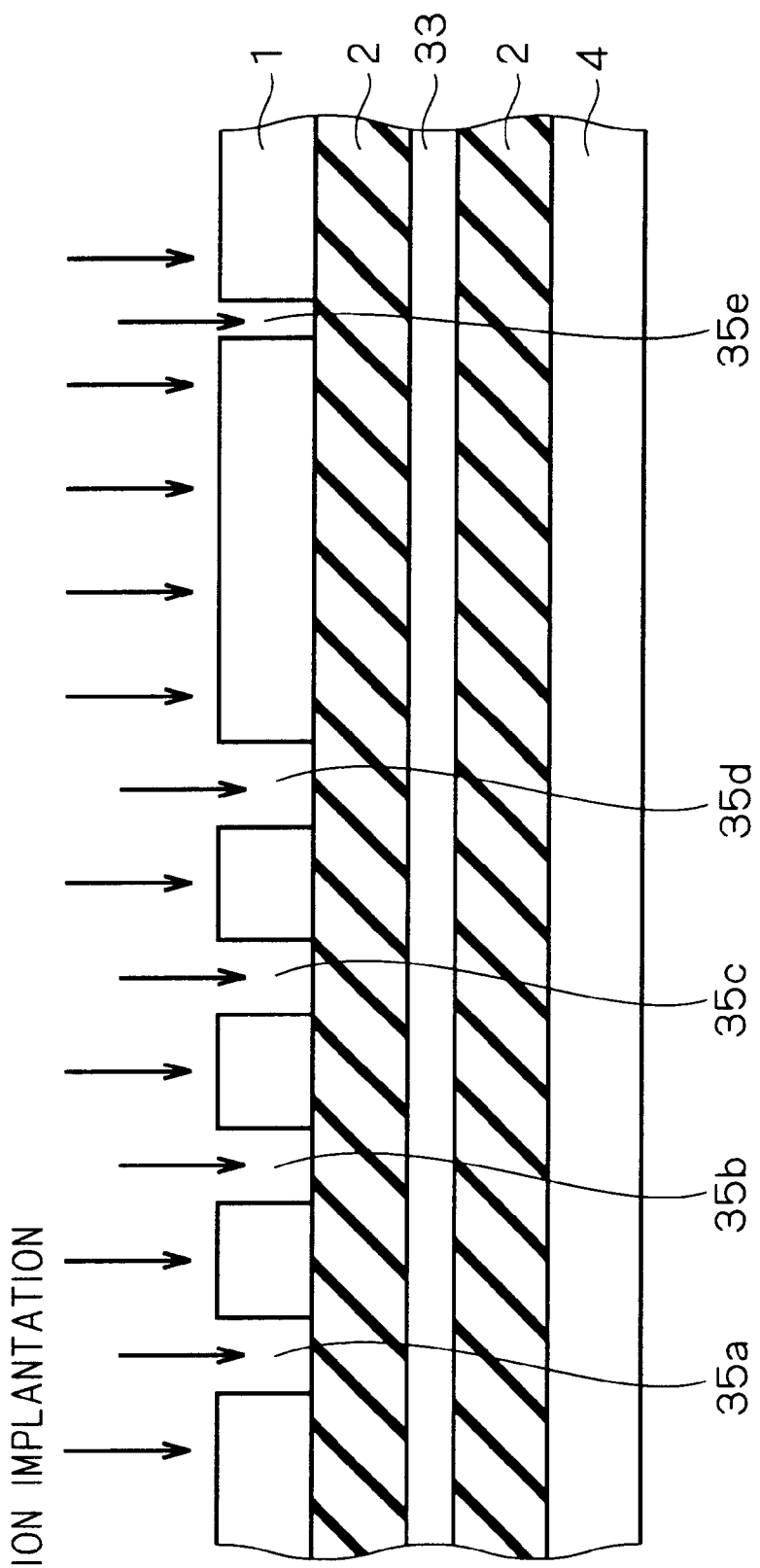
Figure 46:
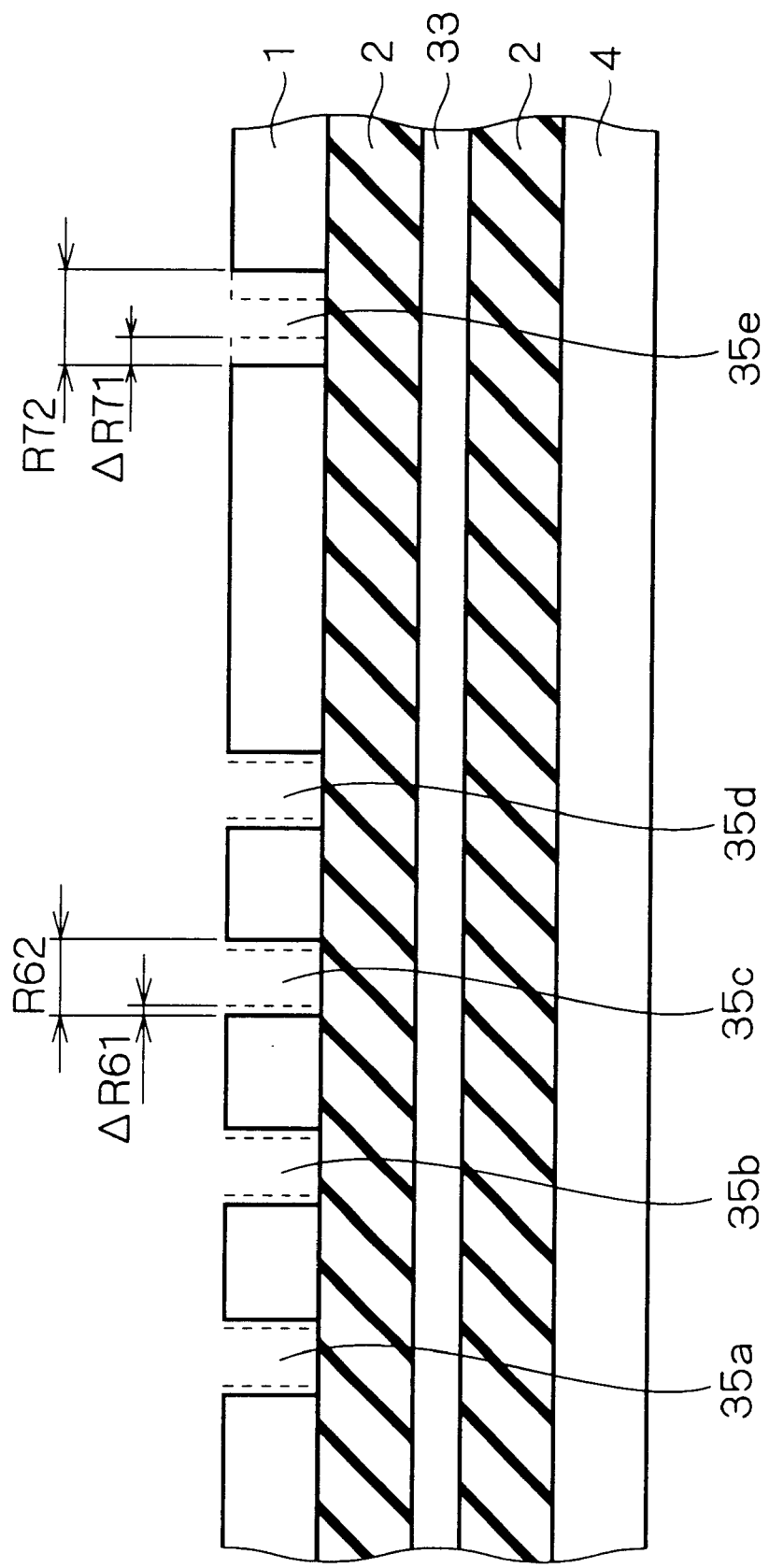

Then, as shown in FIG. 45, $Ar^+$ ions of an inert gas, for example, are implanted vertically into the surface of the resist 1. The ion implantation in the resist 1, as shown in FIG. 46, shrinks the resist 1 and increases the hole diameters R61 of the holes 35a to 35d to R62 and the hole diameter R71 of the hole 35e to R72. At this time, as has been previously described with FIG. 5, the amount of increase $\Delta R6$ in the hole diameters R61 of the holes 35a to 35d of small hole pitches is smaller than the amount of increase $\Delta R71$ in the hole diameter R71 of the hole 35e of a great hole pitch. Therefore, the hole diameters R62 of the holes 35a to 35d after ion implantation are nearly equal to the hole diameter R72 of the hole 35e. The ion implantation in the resist 1 also improves the resistance to etching.

Figure 47:
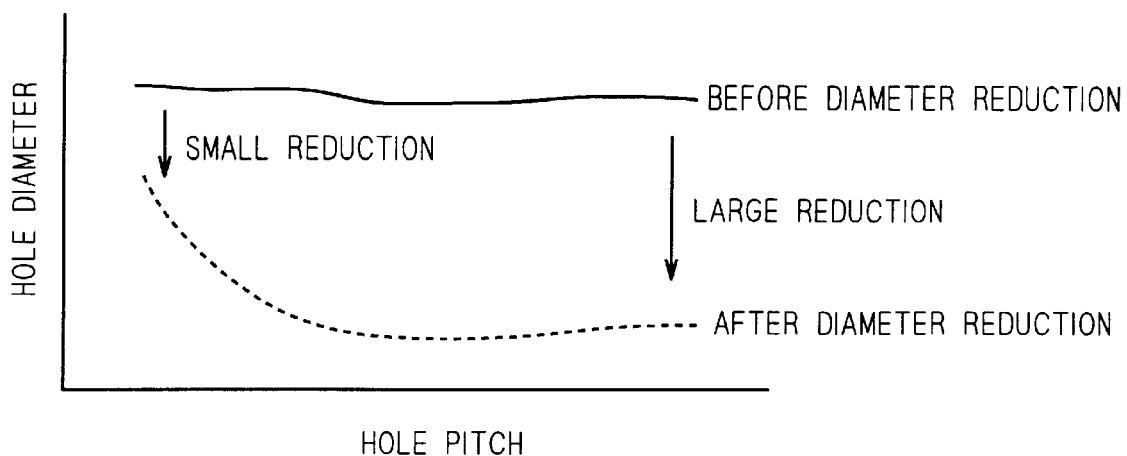
FIGS. 47 and 48 are graphs of the relationship between hole pitch and hole diameter in the method of manufacturing a semiconductor device according to the fourth preferred embodiment.
Figure 48:
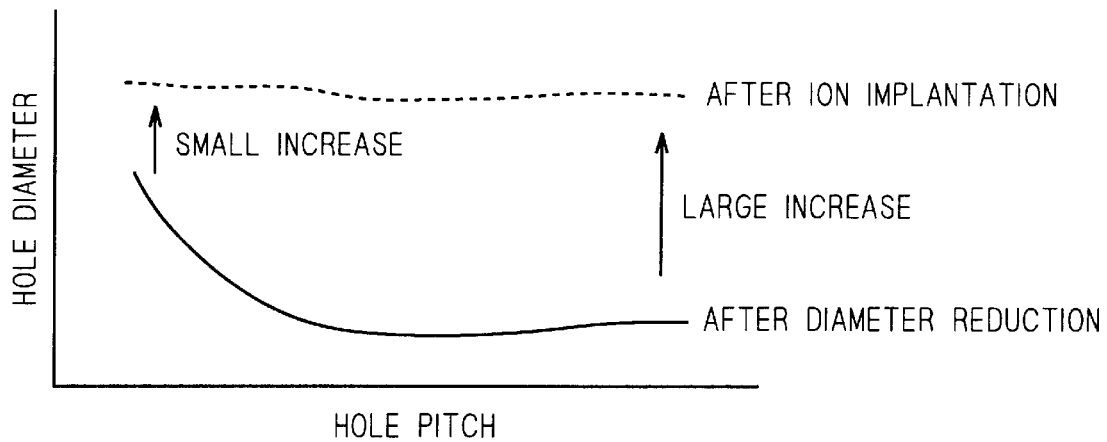
Figure 49:
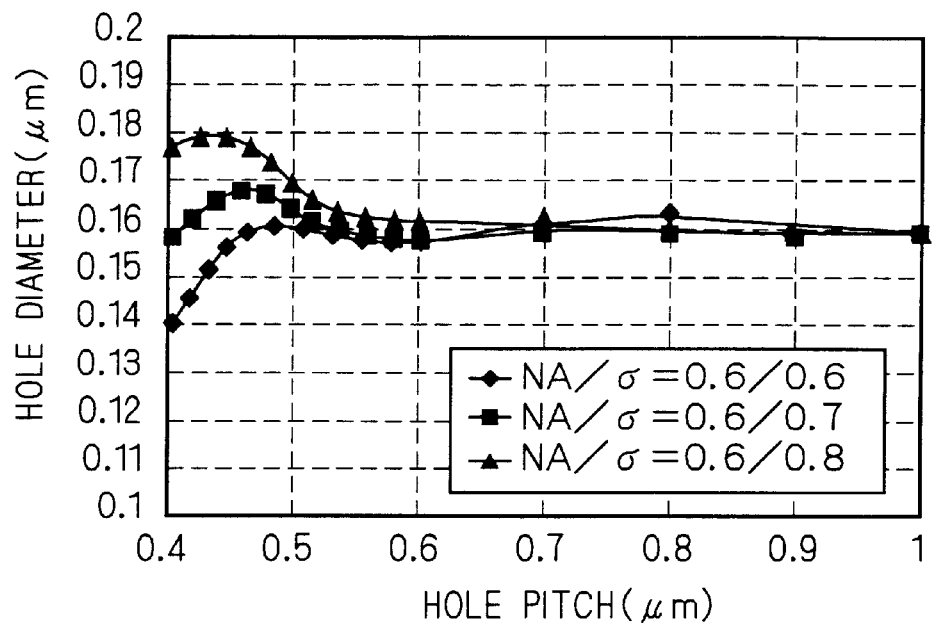
FIGS. 49 and 50 are graphs of the relationship between hole pitch and hole diameter of a resist hole according to a conventional technique.
Figure 50:
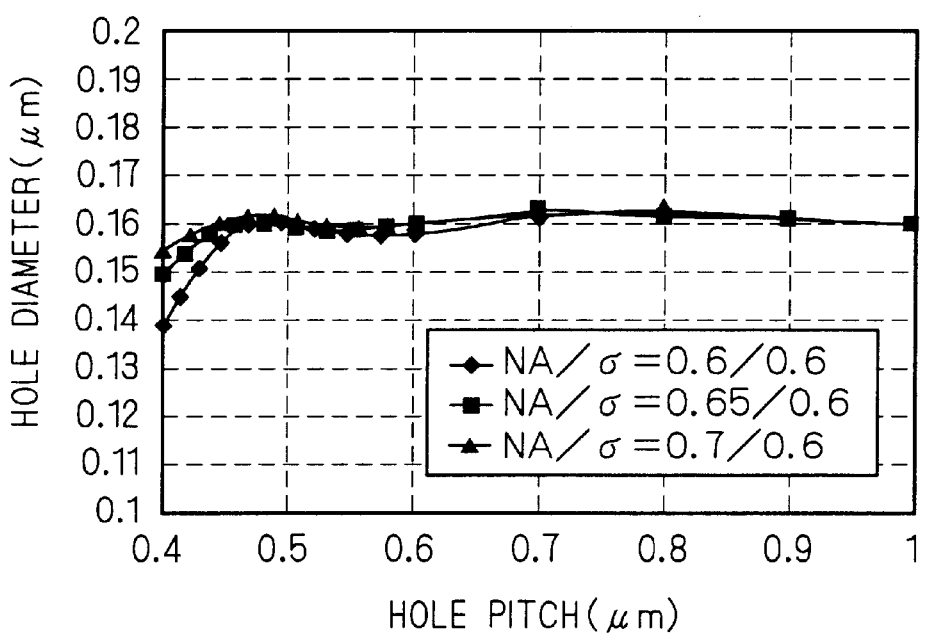

FIG. 47 is a graph showing the relationship between the hole pitch and the hole diameter after hole-diameter reduction processing, and FIG. 48 is a graph showing the relationship between the hole pitch and the hole diameter after ion implantation. The graph of FIG. 47 corresponds to the step of FIG. 44 and the graph of FIG. 48 to the step of FIG. 46. As shown in FIG. 47, the hole-diameter reduction processing, which is performed on holes of about the same hole diameter irrespective of their hole pitches, develops pitch dependence of the hole diameters. On the other hand, as shown in FIG. 48, ion implantation in a resist with holes having pitch dependence reduces the developed pitch dependence of the hole diameters and returns the hole diameters to the values before the hole-diameter reduction processing. That is, the hole diameters after ion implantation are almost the same irrespective of the hole pitches. Further, the ion implantation in resist, as has been previously described, improves the resistance to etching. This allows a reduction in the film thickness of the resist.

While in the fourth preferred embodiment, the hole diameters before the hole-diameter reduction processing are nearly uniform, they may already have pitch dependence as shown in FIG. 3. In this case, the pitch dependence is further developed by the hole-diameter reduction processing, but subsequent ion implantation reduces the developed pitch dependence. Therefore, it is possible to form holes which have hole diameters before the hole-diameter reduction processing.

In the fourth preferred embodiment, the distance between each of the holes 35a to 35d and the distance between the holes 35e and 35d are defined by the hole pitch, it may be defined by the hole interval. At this time, the hole interval for each of the holes 35a to 35d is smaller than that for the hole 35e.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) forming a resist on an object to be etched;
   (b) forming in said resist a plurality of holes a pitch of which includes different pitches; and
   (c) performing ion implantation on said resist to reduce pitch dependence caused to diameters of said holes.

2. The method of manufacturing a semiconductor device according to claim 1, further comprising the step of:
   (d) between said steps (b) and (c), performing processing for reduction of the diameters of said holes.

3. A method of manufacturing a semiconductor device, comprising the steps of:
   (a) forming a resist on an object to be etched; and
   (b) forming a plurality of holes in said resist,
   wherein said holes include a first hole of a first pitch and a second hole of a second pitch larger than said first pitch,
   said method further comprising the step of:
   (c) performing ion implantation on said resist to make the amount of increase in the diameter of said second hole larger than that in the diameter of said first hole.

4. A method of manufacturing a semiconductor device, comprising the steps of:
   (a) forming a resist on an object to be etched;
   (b) forming in said resist a plurality of holes having center-to-center distance of not more than 0.5 μm between holes and having diameters smaller than a desired diameter, and
   (c) performing ion implantation on said resist to increase said diameters of said holes to said desired diameter.

5. The method of manufacturing a semiconductor device according to claim 1, wherein
   an ion used for said ion implantation is an ion of an inert gas.

6. The method of manufacturing a semiconductor device according to claim 2, wherein
   an ion used for said ion implantation is an ion of an inert gas.

7. The method of manufacturing a semiconductor device according to claim 3, wherein
   an ion used for said ion implantation is an ion of an inert gas.

8. The method of manufacturing a semiconductor device according to claim 4, wherein
   an ion used for said ion implantation is an ion of an inert gas.

9. The method of manufacturing a semiconductor device according to claim 5, wherein
   said ion is an Ar ion.

10. The method of manufacturing a semiconductor device according to claim 6, wherein
    said ion is an Ar ion.

11. The method of manufacturing a semiconductor device according to claim 7, wherein
    said ion is an Ar ion.

12. The method of manufacturing a semiconductor device according to claim 8, wherein
    said ion is an Ar ion.

* * * * *